(12) United States Patent
Tomie

(10) Patent No.: US 6,365,961 B1
(45) Date of Patent: Apr. 2, 2002

(54) HIGH-FREQUENCY INPUT/OUTPUT FEEDTHROUGH AND PACKAGE FOR HOUSING HIGH-FREQUENCY SEMICONDUCTOR ELEMENT USING SAME

(75) Inventor: Satoru Tomie, Shiga (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/484,917

(22) Filed: Jan. 18, 2000

Related U.S. Application Data

(62) Division of application No. 09/031,402, filed on Feb. 26, 1998, now Pat. No. 6,043,556.

(30) Foreign Application Priority Data

Feb. 27, 1997 (JP) .............................................. 9-043680

(51) Int. Cl.⁷ .......................... H01L 23/34; H01L 23/48; H01L 23/043; H01L 23/04; H01L 23/17
(52) U.S. Cl. ...................... 257/664; 257/728; 257/699; 257/708; 257/698; 257/678; 257/730; 257/731
(58) Field of Search ................................. 257/728, 664, 257/699, 708, 698, 678, 730, 731

(56) References Cited

U.S. PATENT DOCUMENTS

| | | | |
|---|---|---|---|
| 4,890,155 A | * 12/1989 | Miyagawa et al. | 357/74 |
| 5,574,314 A | * 11/1996 | Okada et al. | 257/728 |
| 6,043,556 A | * 3/2000 | Tomie | 257/664 |

FOREIGN PATENT DOCUMENTS

| | | | |
|---|---|---|---|
| JP | 59-172884 | | 7/1986 |
| JP | 401232751 A | * | 9/1989 |
| JP | 402087701 A | * | 3/1990 |
| JP | 2291152 | | 11/1990 |
| JP | 404368004 | * | 12/1992 |
| JP | 5183301 | | 7/1993 |
| JP | 5199016 | | 8/1993 |
| JP | 11339898 A | * | 12/1999 |

\* cited by examiner

*Primary Examiner*—Carl Whitehead, Jr.
*Assistant Examiner*—James Mitchell
(74) *Attorney, Agent, or Firm*—Hogan & Hartson L.L.P.

(57) ABSTRACT

A high-frequency input/output feedthrough comprises a lower dielectric substrate in which are formed a bottom face ground layer, side ground layers, a line conductor and cofacial ground layers (formed on both sides of the line conductor on one and the same face of the lower dielectric substrate); and an upper dielectric substrate joined to the lower dielectric substrate so that portions of the line conductor and cofacial ground layers are sandwiched between the lower and upper dielectric substrate. In order to suppress return and insertion losses of signal in millimeter wave range due to a difference in transmission mode to improve transmission characteristics, the upper dielectric substrate is made thicker than the lower dielectric substrate. The width of the portion of the line conductor which is sandwiched between the lower dielectric substrate and the upper dielectric substrate is smaller than that of another portion. The cofacial ground layers are projected toward the line conductor. The transmission modes for high-frequency signals are matched, so that the return and insertion losses can be reduced and excellent transmission characteristics of high-frequency signals can be attained.

20 Claims, 14 Drawing Sheets

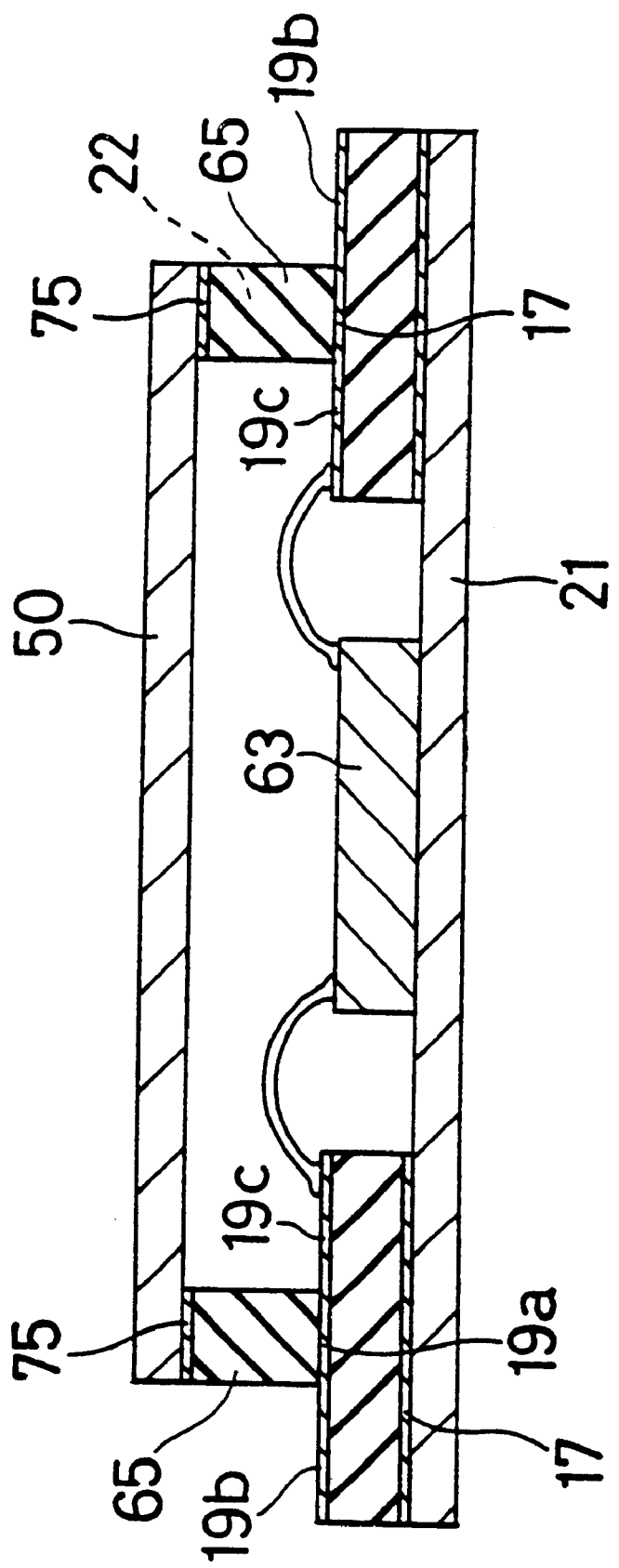

HIGH-FREQUENCY INPUT/OUTPUT FEEDTHROUGH AND PACKAGE FOR HOUSING HIGH-FREQUENCY SEMICONDUCTOR ELEMENT USING SAME

This is a division of application Ser. No. 09/031,402 filed Feb. 26, 1998 now U.S. Pat. No. 6,043,556, which application is hereby incorporated by reference in its entirety.

BACKGROUND OF THE INVENTION

1. Field of the Invention

The present invention relates to a high-frequency input/output feedthrough for a package for housing a high-frequency semiconductor element for the millimeter wave region or the like, and also to a package for housing a high-frequency semiconductor element and using the high-frequency input/output feedthrough.

2. Description of the Related Art

A package for housing a high-frequency semiconductor element houses a high-frequency semiconductor element using a high-frequency signal in the micrometer wave region, the millimeter wave region, or the like, in a hermetically sealed manner. A signal input/output portion of such a package employs a feedthrough structure to which a transmission line such as a microstrip line or a stripline is joined and which is hermetically sealed while a semiconductor element is housed in the package.

An example of the configuration of such an input/output feedthrough is shown in FIGS. 19A, 19B, and FIG. 19A is a plane view and FIG. 19B is a sectional view taken along line I—I of FIG. 19A, in which lower dielectric substrate 1 is made of ceramics or the like. An upper dielectric substrate 2 is made of ceramics or the like and joined to the upper face of the lower dielectric substrate 1, and serves as a part of a case wall of a package. A line conductor 3 is formed on the upper face of the lower dielectric substrate 1. Side face ground layers 4 are formed on the side faces of the lower and upper dielectric substrates 1 and 2. A bottom face ground layer 5 is formed on the bottom face of the lower dielectric substrate 1. An upper-face ground layer 6 is formed on the upper face of the upper dielectric substrate 2. The prior art of FIG. 7 is the configuration of an input/output feedthrough used for so-called metal wall type packages.

According to this input/output feedthrough, the matching of the characteristic impedance of the line conductor 3 is attained by changing the line width of the portion sandwiched between the lower dielectric substrate 1 and the upper dielectric substrate 2 and corresponding to the stripline, with respect to that of the portions in front and in rear of the portion and corresponding to a microstrip line, thereby realizing low return and insertion losses. When an input/output feedthrough having the bottom face ground layer 5 and the side face ground layers 4 on the sides of the dielectric substrates 1 and 2 is embedded in a cutaway part formed in a metal substrate of the package, the isolation characteristics between the line conductor 3 and a line conductor of another input/output feedthrough which is juxtaposed to the line conductor 3 are improved.

In another input/output feedthrough, a ground pattern is disposed on both sides of a line conductor as shown in FIGS. 20A and 20B. FIG. 20A is a plane view, and FIG. 20B is a section view taken along line II—II. Referring to these figures, a lower dielectric substrate 7, an upper dielectric substrate 8, a line conductor 9, a bottom face ground layer 10, and an upper-face ground layer 11 are configured in the same manner as the lower dielectric substrate 1, the upper dielectric substrate 2, the line conductor 3, the bottom face ground layer 5, and the upper-face ground layer 6 of FIG. 19, respectively. Ground patterns 12 are formed on the lower dielectric substrate 7 so as to laterally sandwich the line conductor 9. Through conductors 13 are through hole conductors or the like through which the ground patterns 12 are connected to the bottom face ground layer 10. Through conductors 14 are through holes or the like through which the ground patterns 12 are connected to the upper-face ground layer 11. The prior art of FIG. 20 has the configuration of an input/output feedthrough used for the so-called ceramic wall type packages. According to this input/output feedthrough, in the same manner as the input/output feedthrough shown in FIG. 19, the matching of the characteristic impedance of the line conductor 9 is attained so as to realize low return and insertion losses. Furthermore, the isolation characteristics are improved by surrounding the line conductor 9 with the ground patterns 12, the through conductors 13 and 14, the bottom face ground layer 10, and the upper-face ground layer 11.

In each of the high-frequency input/output feedthroughs, the lower dielectric substrate 1 or 7 and the upper dielectric substrate 2 or 8 which constitute the stripline portion are usually made of the same dielectric material and configured as dielectric members having a substantially same thickness.

According to such a high-frequency input/output feedthrough of the prior art, in the region (the microwave region) wherein the frequency is relatively low among high frequencies, the transmission characteristics for a high-frequency signal are excellent because the characteristic impedance of the microstrip line portion is matched with that of the stripline portion.

However, for example, in a higher frequency region wherein the frequency is higher than 30 GHz (the millimeter wave region) there arises the following problem. In order to match the characteristic impedance of the line conductor 3, 9 in the stripline portion with that in the microstrip line portion and further suppress a higher order modes, it is necessary to decrease the thickness of the lower dielectric substrate 1, 7 and additionally, since a width d1 of the line conductor in the stripline portion is very small and an unstable state is brought, it is necessary to set a length d2 of the line conductor 3, 9 in the stripline portion to 1/2n (n is a natural number) of the wavelength of a high-frequency signal to be transmitted via the input/output feedthrough, with the result that the length d2 of the line conductor 3, 9 in the stripline portion becomes very short. Consequently, the strength of the input/output feedthrough part is extremely lowered. Even when the length is designed to be 1/2n of the wavelength, the transmission mode in the stripline portion is substantially different from that in the microstrip line portions in front and in rear of the stripline portion because the input/output feedthrough part has a complex three-dimensional shape and the shape is dispersedly produced. This produces a further problem in that the return and insertion losses are increased and the transmission characteristics for a high-frequency signal are impaired.

The configuration shown in FIG. 8 has further problems in that it is difficult to produce the input/output feedthrough because the small through conductors 13, 14 must be formed in the dielectric substrates 7 and 8, and that, because of the shield due to the through conductors, the return and insertion losses are larger as compared with the case of a planar shield.

SUMMARY OF THE INVENTION

The invention has been conducted in view of the above-discussed problems. It is an object of the invention to provide a high-frequency input/output feedthrough having excellent transmission characteristics in which the transmission mode for a high-frequency signal in a portion corresponding to a microstrip line is matched with that in a portion corresponding to a stripline portion to reduce the return and insertion losses.

It is another object of the invention to provide a package for housing a high-frequency semiconductor element having excellent transmission characteristics in which, in an input/output feedthrough part, the transmission mode for a high-frequency signal in a portion corresponding to a microstrip line is matched with that in a portion corresponding to a stripline, to reduce the return and insertion losses.

In a first aspect of the invention, a high-frequency input/output feedthrough comprises:

a) a first dielectric substrate 15;

b) a high-frequency transmission line 19 of narrow width extending on one surface of the first dielectric substrate, the high-frequency transmission line having a first high-frequency transmission line portion 19a and second high-frequency transmission line portions 19b, 19c extending from both longitudinal ends of the first high-frequency transmission line portion, respectively;

c) a pair of first ground conductors 20 of narrow width extending on the one surface of the first dielectric substrate, the first ground conductors being spaced from both width direction sides of the high-frequency transmission line, respectively, each of the first ground conductors having a first ground conductor portion 20a extending along the first high-frequency transmission line portion 19a and second ground conductor portions 20b, 20c extending from both longitudinal ends of the first ground conductor portion along the second high-frequency transmission line portions 19b, 19c, respectively;

d) a second dielectric substrate 16 for hermetic sealing, overlaid on the one surface of the first dielectric substrate so as to cover the first high-frequency transmission line portion and the first ground conductor portions; and e) a second ground conductor 17 formed on the other surface of the first dielectric substrate over an region including the high-frequency transmission line 19, the first ground conductors 20, and gaps having widths g1 to g4 between the high-frequency transmission line and the first ground conductors, in a thickness direction of the first dielectric substrate, the second ground conductor constituting first line means 38 together with the first high-frequency transmission line portion, the first ground conductor portions and the first and second dielectric substrates and constituting second line means 39, 40 together with the second high-frequency transmission line portion, the second ground conductor portions and the first dielectric substrate, wherein a first width W19a of the first high-frequency transmission line portion is smaller than a second width W19 of the second high-frequency transmission line portion (W19a<W19), a first distance G1 between the first ground conductor portions 20a on both sides of the first high-frequency transmission line portion 19a in the width direction of the first ground conductor portions 20a is equal to or smaller than a second distance G2 between the second ground conductor portions 20b or 20c on both sides of the second high-frequency transmission line portion 19b, 19c (G1≦G2) in the width direction of the first ground conductor portions 20b, 20c and a thickness d16 of the second dielectric substrate is selected to be larger than a thickness d15 of the first dielectric substrate (d16>d15), and the first width W19a and the regions g1, g2 between the first high-frequency transmission line portion and the first ground conductor portions are selected so that a characteristic impedance Z19a of the first line means is smaller than a characteristic impedance 19 of the second line means (Z19a<Z19), in order to make approximation of a transmission mode of the first line means to a transmission mode of the second line means.

In a second aspect of the invention, the first width W19a and first gaps g1, g2 are selected so that the a ratio Z19a/Z19 of the characteristic impedance Z19a of the first line means to the characteristic impedance 19 of the second line means meets the following relationship:

0.5≦Z19a/Z19≦0.9

In a third aspect of the invention, a high-frequency input/output feedthrough comprises:

a first dielectric substrate having one surface where a line conductor and cofacial ground layers spaced at a same distance from both sides of the line conductor uniformly in a longitudinal direction of the line conductor are formed, the other surface where a bottom face ground layer is formed, and side faces where side ground layers are formed; and a second dielectric substrate joined to the one surface of the first dielectric substrate so as to sandwich portions of the line conductor and the cofacial ground layers between the first and second substrates, wherein the second dielectric substrate is made thicker than the first dielectric substrate, the portion of the line conductor sandwiched between the first and second substrates is made narrower than the other portions thereof in width, and the portions of the cofacial ground layers sandwiched between the first and second substrates project toward the line conductor uniformly in a longitudinal direction of the line conductor so as to be spaced at a same distance from both sides of the line conductor.

In a fourth aspect of the invention, the first dielectric substrate has a dielectric constant $\in_r 15$ and a thickness d15, and a thickness d16 of the second dielectric substrate having a dielectric constant $\in_r 16$ is $\in_r 15/(2\sqrt{\in_r 16})$ or more times the thickness d15 of the first dielectric substrate.

In a fifth aspect of the invention, the thickness d16 of the second dielectric substrate is $\in_r 15/\sqrt{\in_r 16}$ or more times the thickness d15 of the first dielectric substrate.

In a sixth aspect of the invention, heights h1, h2 of the projections toward the line conductor of the portions of the cofacial ground layers sandwiched between the first and second dielectric substrates or the gaps g1, g2 between the line conductor and the cofacial ground layers are $\in_r 15/(2\sqrt{\in_r 16})$ or less times the thickness d15 of the first dielectric substrate.

In a seventh aspect of the invention, the dielectric constant $\in_r 15$ of the first dielectric substrate is smaller than the dielectric constant $\in_r 16$ of the second dielectric substrate.

In an eighth aspect of the invention, an upper ground layer is provided on a surface of the second dielectric substrate of an opposite side to the first dielectric substrate, and side ground layers are provided on side faces of the second dielectric substrate.

In a ninth aspect of the invention, the first and second dielectric substrates are made of one or more materials selected from a group of materials including alumina, mullite, glass ceramics, polytetrafluoroethylene (PTFE), glass epoxy resins and polyimides.

In a tenth aspect of the invention, the line conductor and the cofacial ground layers are made of one or more materials selected from a group of materials including Cu, MoMn+Ni+Au, W+Ni+Au, Cr+Cu, Cr+Cu+Ni+Au, Ta$_2$N+NiCr+Au, Ti+Pd+Au, and NiCr+Pd+Au.

In an eleventh aspect of the invention, a package for housing a high-frequency semiconductor element comprises:

a substrate made of a dielectric or metal, having one surface including a mounting portion on which the high-frequency semiconductor element is mounted;

a frame made of a dielectric or metal, joined to the substrate so as to enclose the mounting portion, the frame being notched to form an input/output feedthrough mounting portion whose side faces and bottom face are electrically conductive;

the high-frequency input/output feedthrough of any one of the above-mentioned constructions, fitted to the input/output feedthrough mounting portion; and a cap attached to a top face of the frame.

In a twelfth aspect of the invention, a package for housing a high-frequency semiconductor element comprises:

a dielectric substrate having one surface including a mounting portion on which the high-frequency semiconductor element is mounted;

a line conductor formed from a proximity of the mounting portion to a proximity of a periphery of the dielectric substrate on the one surface of the dielectric substrate;

first ground layers arranged from a proximity of the mounting portion to a proximity of a periphery of the dielectric substrate on the one surface of the dielectric substrate so as to be spaced at a same distance from both sides of the line conductor;

a dielectric frame joined to the one surface of the dielectric substrate so that the mounting portion is enclosed by the dielectric frame and portions of the line conductor and the first ground layers are sandwiched between the dielectric substrate and the dielectric frame;

a second ground layer formed on the other surface of the dielectric substrate; and a connecting conductor layer for connecting the second ground layer to the first ground layers, wherein the dielectric frame is made thicker than the dielectric substrate, the portion of the line conductor sandwiched between the dielectric substrate and the dielectric frame is made narrower than the other portions thereof in width, and the portions of the first ground layers sandwiched between the dielectric substrate and the dielectric frame project toward the line conductor uniformly in a longitudinal direction of the line conductor so as to be spaced at a same distance from both sides of the line conductor.

In a thirteenth aspect of the invention, the dielectric substrate has a dielectric constant $\in_r 15$ and a thickness d15, and a thickness d16 of the dielectric frame having a dielectric constant $\in_r 16$ is $\in_r 15/(2\sqrt{\in_r 16})$ or more times the thickness d15 of the dielectric substrate.

In a fourteenth aspect of the invention, the thickness d16 of the dielectric frame is $\in_r 15/(\sqrt{\in_r 16})$ or more times the thickness d15 of the dielectric substrate.

In a fifteenth aspect of the invention, heights h1, h2 of the projections toward the line conductor of the portions of the first ground layers sandwiched between the dielectric substrate and the dielectric frame or the gaps g1, g2 between the line conductor and the first ground layers are $\in_r 15/(2\sqrt{\in_r 16})$ or less times the thickness d15 of the first dielectric substrate.

In a sixteenth aspect of the invention, the dielectric constant $\in_r 15$ of the dielectric substrate is smaller than the dielectric constant $\in_r 16$ of the dielectric frame.

In a seventeenth aspect of the invention, an upper ground layer is provided on a surface of the dielectric frame of an opposite side to the dielectric substrate, and side ground layers are provided in an interior of the dielectric frame above the connecting conductor layer.

In an eighteenth aspect of the invention, the dielectric substrate and the dielectric frame are made of one or more materials selected from a group of materials including alumina, mullite, glass ceramics, polytetrafluoroethylene (PTFE), glass epoxy resins and polyimides.

In a nineteenth aspect of the invention, the line conductor and the first ground layers are made of one or more materials selected from a group of materials including Cu, MoMn+Ni+Au, W+Ni+Au, Cr+Cu, Cr+Cu+Ni+Au, Ta$_2$N+NiCr+Au, Ti+Pd+Au, and NiCr+Pd+Au.

In a twentieth aspect of the invention, a high-frequency semiconductor apparatus comprises:

a semiconductor element installed in a space on the dielectric substrate of the package for housing a high-frequency semiconductor element of any one of the above-mentioned constructions, enclosed by the frame, the semiconductor element being electrically connected to the input/output feedthrough for high-frequency.

According to the high-frequency input/output feedthrough of the invention, the width w19a of the portion 19a of the line conductor 19 which is sandwiched between the lower dielectric substrate 15 and the upper dielectric substrate 16 is smaller than the width w19 of the other portions 19b, 19c, and the portions 20a1 of the cofacial ground layers disposed on both sides of the line conductor to be spaced at the same distance from both sides of the line conductor are projected toward the portion 19a of the line conductor 19 by the heights h1, h2, respectively, so that gaps g1, g2 (g1=g2)are preserved. Therefore, the electric field distribution in the portion in which the line conductor is sandwiched between the lower dielectric substrate and the upper dielectric substrate and which corresponds to the stripline becomes similar to the electric field distributions in the other portions which are in front and in rear of the portion, in which the line conductor is exposed, and which correspond to the microstrip line. This causes the transmission modes for a high-frequency signal in the two kinds of portions to become similar to each other. Even when the characteristic impedances of the two kinds of portions are different from each other, therefore, return and insertion losses due to a difference of the transmission modes are not produced. As a result, excellent transmission characteristics for a high-frequency signal can be obtained.

According to the package for housing a high-frequency semiconductor element of the invention, the high-frequency input/output feedthrough part is structured by using the above-mentioned high-frequency input/output feedthrough of the invention. In a transmission of a high-frequency signal between a high-frequency semiconductor element housed in the package and an external electric circuit, therefore, return and insertion losses due to a difference of the transmission modes in the input/output feedthrough are not produced. Consequently, a package for housing a high-frequency semiconductor element which has excellent transmission characteristics for a high-frequency signal and which has superior high-frequency characteristics can be obtained.

As a result, According to the invention, it is possible to provide a high-frequency input/output feedthrough in which the transmission modes for a high-frequency signal in a line conductor are matched with each other, thereby reducing the return and insertion losses, and which has excellent transmission characteristics.

According to the invention, it is possible to provide a package for housing a high-frequency semiconductor element in which the transmission modes for a high-frequency signal in a line conductor of an input/output feedthrough part are matched with each other, thereby reducing the return and insertion losses, and which has excellent transmission characteristics.

BRIEF DESCRIPTION OF THE DRAWINGS

Other and further objects, features, and advantages of the invention will be more explicit from the following detailed description taken with reference to the drawings wherein:

FIG. 18 is a sectional view of the semiconductor apparatus of FIG. 17;

DETAILED DESCRIPTION OF THE PREFERRED EMBODIMENTS

Figure 1A:
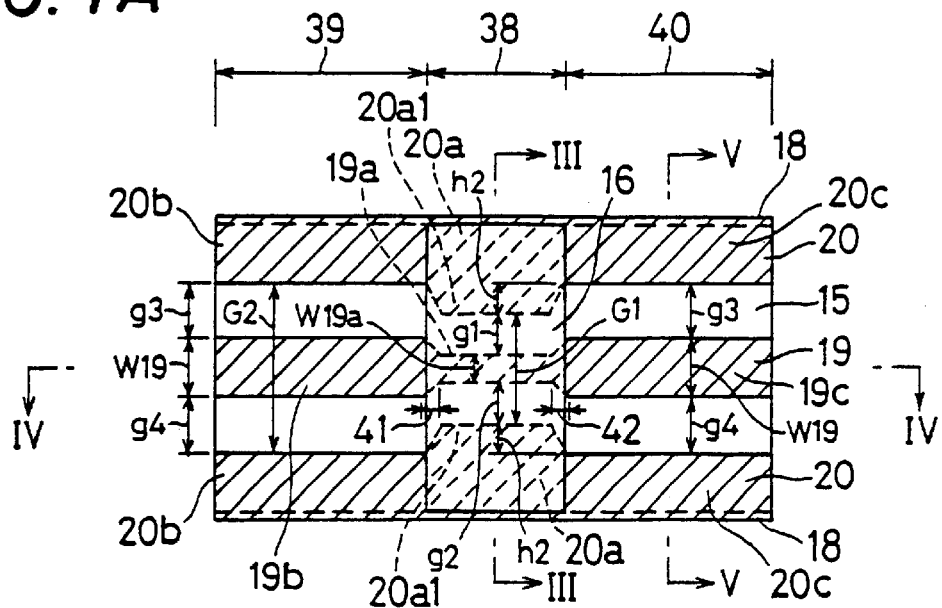
FIG. 1A is a plane view showing a high-frequency input/output feedthrough of an embodiment of the invention.

Now referring to the drawings, preferred embodiments of the invention are described below.

Hereinafter, the invention will be described with reference to the accompanying drawings. The invention is not restricted to embodiments described below, and various changes and modifications may be made in the invention without departing from the scope thereof.

In the drawings, parts except sectional parts are hatched by continuous or broken lines for ready appreciation. An input/output feedthrough of the invention is used in a high-frequency range, namely a range of 30 to 300 GHz, preferably a range of 40 to 70 GHz.

Figure 1B:
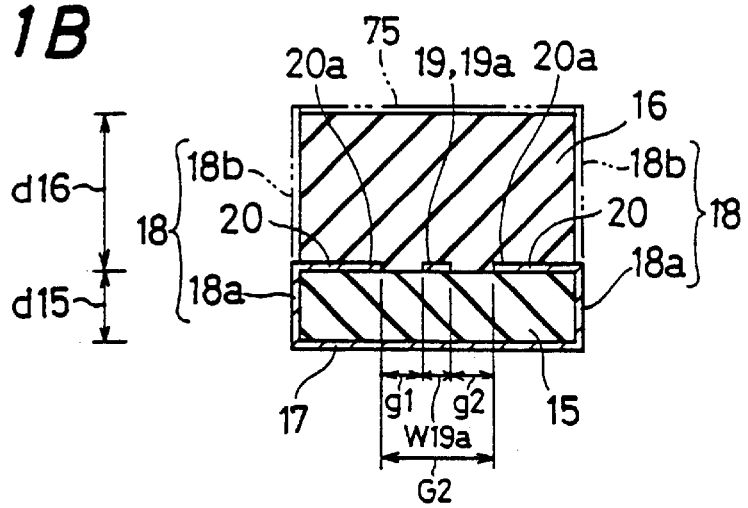
FIG. 1B is a sectional view taken along line III—III of FIG. 1A.
Figure 1C:
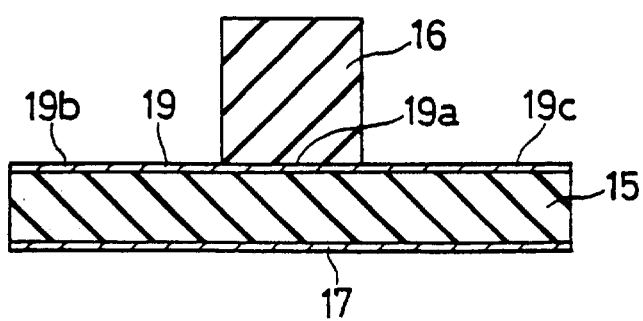
FIG. 1C is a sectional view taken along line IV—IV of FIG. 1A.

FIG. 1 shows an embodiment of the high-frequency input/output feedthrough of the invention. FIG. 1A is a plane view, and FIG. 1B is a sectional view taken along line III—III of FIG. 1A, and FIG. 1C is a sectional view taken along line IV—IV of FIG. 1A.

Figure 2A:
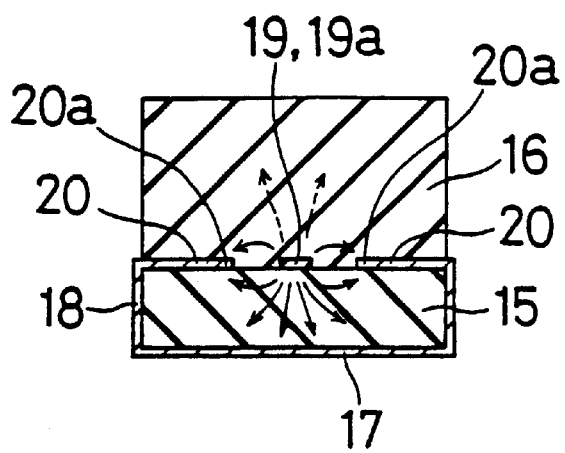
FIGS. 2A and 2B are sectional views taken along lines III—III and V—V of FIG. 1A, illustrating the electric field distribution of the high-frequency input/output feedthrough of the invention.
Figure 2B:
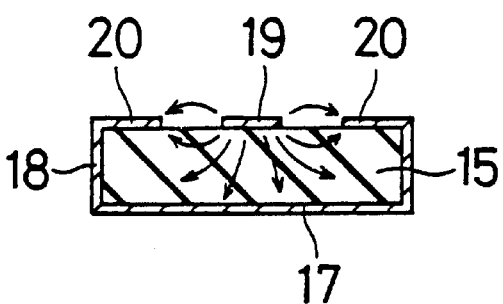

FIGS. 2A and 2B are sectional views taken along lines III—III and V—V of FIG. 1A, illustrating the electric field distribution of the high-frequency input/output feedthrough of FIG. 1.

In these figures, a lower dielectric substrate 15 and an upper dielectric substrate 16 are used also as a hermetically sealing part in a signal input/output feedthrough part of a package for housing a high-frequency circuit. A bottom face ground layer 17 is formed on the entire bottom face of the lower dielectric substrate 15, side face ground layers 18 are formed on the side faces, and a line conductor 19 and cofacial ground layers 20 which are disposed on both sides of the line conductor 19 in the longitudinal direction thereof (left-right direction in FIG. 1A) to be separated from the line conductor 19 at the same distance (namely, g1=g2, g3=g4) are formed on the top face of the lower dielectric substrate 15. The bottom face ground layer 17, the side face ground layers 18, and the cofacial ground layers 20 are connected to each other to form a ground face of the same potential. The side face ground layers 18 are composed of ground layers 18a formed on the lower dielectric substrate 15 and ground layers 18b formed on the upper dielectric substrate 16.

The upper dielectric substrate 16 is joined onto the lower dielectric substrate 15 so as to sandwich portions of the line conductor 19 and the cofacial ground layers 20. A thickness d16 of the upper dielectric substrate 16 is made larger than a thickness d15 of the lower dielectric substrate 15 (d16>d15). A width W19a of the portion 19a of the line conductor 19 sandwiched between the lower dielectric substrate 15 and the upper dielectric substrate 16 is made smaller than a width W19 of the other portions 19b, 19c, i.e., the portions which are in front and in rear of the portion and in which the line conductor 19 is exposed, thereby forming a narrow portion 19a (W19a<W19). Each of the cofacial ground layers has a projected portion 20a1 having a projection height h1, h2 in the thickness direction of the cofacial ground layers toward the narrow portion 19a of the line conductor 19 so as to extend uniformly in the longitudinal direction thereof spaced at the distance g1, g2 (g1=g2) from both sides of the line conductor.

Figure 20A:
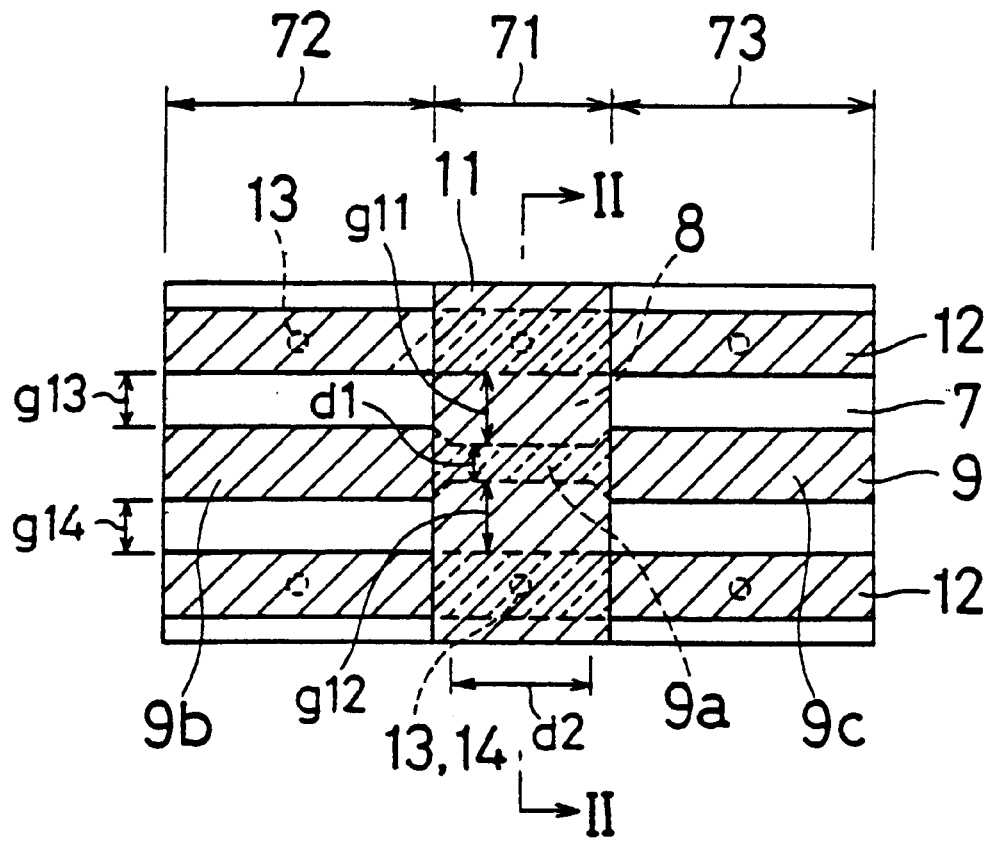
FIG. 20A is a plane view showing another example of a prior art high-frequency input/output feedthrough and FIG. 20B is a sectional view taken along line II—II of FIG. 20A.
Figure 20B:
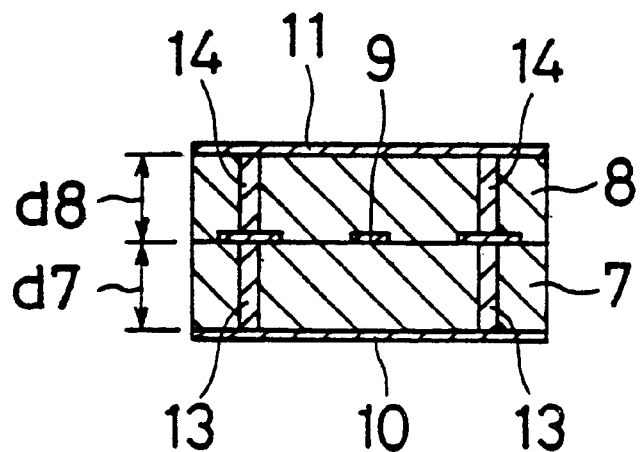

According to the configuration of the high-frequency input/output feedthrough of the prior art as shown in FIG. 20, in line means 71 sandwiched between a lower dielectric substrate 7 of the line conductor 9 and an upper dielectric substrate 8, the thickness of the lower dielectric substrate 7 is nearly equal to that of the upper dielectric substrate 8 (d7=d8), and cofacial ground layers 12 are disposed on both sides of the line conductor 9. However, since such projected portion 20a of the present invention is not provided, the distances g11, g12 between the line conductor 9 and the cofacial ground layers 12 are longer (g11=g12>g13=g14), and additionally since an top face ground layer 11 is formed on the top face of the upper dielectric substrate 8 and side ground layers are formed on the side faces thereof, an electric field on the upper dielectric substrate 8 side distributes toward the top face ground layer in a substantially identical form with that of the lower dielectric substrate 7 side, which is similar to socalled TEM (transverse electromagnetic) mode.

On the other hand, in the line means 72, 73 which are in front and in rear of the above-mentioned portion, since air exists above the line conductor 9, the electric field in the lower dielectric substrate is distributed with being mainly directed to the lower and side face ground layers. Namely, the electric field distribution is of the quasi-TEM mode. Therefore, the TEM mode of the line means 71 and the quasi-TEM mode of the line means 72, 73 are different in transmission mode for high-frequency signals, whereby return and insertion losses are caused.

By contrast, according to the high-frequency input/output feedthrough of the invention, whose electric field distribution is shown by arrows in FIGS. 2A, 2B, as shown in FIG. 2A which is a sectional view taken along line III—III, a line conductor portion 19a of the line conductor 19 is made to have a narrow line width W19a so that the characteristic impedance Z19a of the line means 38 is different from but closely analogous to the characteristic impedance Z19 of the line means 39, 40 (W19a<W19).

To correspond to the line conductor portion 19a of the line conductor 19, the thickness d16 of the upper dielectric substrate 16 is made larger than the thickness d15 of the lower dielectric substrate 15, and in addition the cofacial ground layers are provided with the projected portions 20a1 which are spaced at the same distance from both sides of the line conductor (g1=g2), to avoid the distances g1, g2 from exceeding the distances g3, g4. Accordingly, the electric field is concentrated on the lower dielectric substrate 15 side toward the bottom face ground layer 17 and the cofacial ground layers 20, and on the upper dielectric substrate 16 side, the electric field distribution as shown by arrows of broken line in FIG. 2A can be substantially eliminated, so that the electric field distribution of the line means 38 can be shaped into the form of quasi-TEM mode, and can be made closely analogous to the quasi-TEM mode of electric distribution as shown in FIG. 2B which is a sectional view taken along line V—V. As a result, the transmission mode for high-frequency signals of the line conductor portion 19a can be made closely analogous to that of the line conductor portions 19b, 19c, and although a difference occurs between the characteristic impedance Z19a of the line means 38 including the line conductor portion 19a sandwiched between the lower dielectric substrate 15 and the upper dielectric substrate 16 and the characteristic impedance Z19 of the line means 39, 40 including the line conductor portions 19b, 19c, return and insertion losses due to the difference in transmission mode can be reduced, with the result that the input/output feedthrough has excellent transmission characteristics.

The first distance G1 between the first ground conductor portions 20a in the width direction thereof on both sides of the first high-frequency transmission line portion 19a is equal to or smaller than the second distance G2 between the second ground conductor portions 20b; 20c in the width direction thereof on both sides of the second high-frequency transmission line portion 19b; 19c (G1≦G2).

In the embodiment, although the input/output feedthrough is configured symmetrical about a plane perpendicular to a paper sheet of FIG. 1A including line IV—IV of FIG. 1, the input/output feedthrough may be configured asymmetrical, that is g1≠g2 and g3≠g4.

The lower and upper dielectric substrates 15, 16 are made of one or more materials selected from a group of materials including, for example, a ceramic material such as alumina or mullite, so-called glass ceramics (glass and ceramics), or a resin material such as Teflon (PTFE), glass epoxy, or polyimide.

The thickness and width of each of the dielectrics are set in accordance with the frequency of the high-frequency signal to be transmitted, the characteristic impedance, etc. In the invention, it is important to make the thickness d16 of the upper dielectric substrate 16 larger than the thickness d15 of the lower dielectric substrate 15. Preferably, the thickness d16 of the upper dielectric substrate 16 in the narrow portion 19a of the line conductor 19 is $\varepsilon_r15/\varepsilon_r16^{1/2}$ or more times the thickness d15 of the lower dielectric substrate 15.

$$d16 \geq d15 \cdot \frac{\varepsilon_r15}{\sqrt{\varepsilon_r16}} \quad (1)$$

In this case, the electric field distribution in a plane perpendicular to the transmission direction in the narrow portion 19a of the line conductor 19 is concentrated in a more conspicuous manner toward the bottom face ground layer 17 side and the side face ground layers 18 side, so that the transmission mode (refer to FIG. 2B) can be made similar to that of the line conductor portions 19b, 19c of the line conductor 19 in front and rear of the narrow portion 19a. Therefore, the transmission characteristics for high-frequency signals are further improved.

By contrast, when the thickness d16 of the upper dielectric substrate 16 is less than $\varepsilon_r15/(2\times\varepsilon_r16^{1/2})$ times the thickness d15 of the lower dielectric substrate 15, it seems from results of the inventor's actual measurement that that adversely affects the degree of electromagnetic coupling. Therefore, it is preferable to set the thickness d16 of the upper dielectric substrate 16 to be $\varepsilon_r15/(2\times\varepsilon_r16^{1/2})$ or more times the thickness d15 of the lower dielectric substrate 15. By satisfying the following relation, the transmission mode of the second line means (refer to FIG. 2A) is made similar to the transmission mode of the second line means 39, 40 (refer to FIG. 2B), with the result that the input/output feedthrough of the invention is realized in which the return of electromagnetic waves is reduced.

$$d16 \geq d15 \cdot \frac{\varepsilon_r 15}{2\sqrt{\varepsilon_r 16}} \quad (2)$$

For example, when alumina ($\in_r=9$) is used as the dielectric material, $\in_r 15/(2\times\in_r 16^{1/2})=1.5$. Consequently, it is preferable to set the thickness d16 of the upper dielectric substrate 16 to be 1.5 or more times the thickness d15 that of the lower dielectric substrate 15.

The upper dielectric substrate 16 may be made of the same material as that of the lower dielectric substrate 15. Alternatively, when the dielectric constant ∈ 16 of the upper dielectric substrate 16 is made smaller than ∈ 15 of the lower dielectric substrate 15 (∈16<∈15), the above-mentioned effects are attained more remarkably, and therefore this configuration is preferable. According to this configuration, even when the distances g1, g2 between the projected portions 20a1 and the narrow portion 19a are made larger, namely, the projection heights h1, h2 are made smaller, or h1=0 and h2=0, the return of electromagnetic waves can be reduced to make the transmission modes of the line means 38; 39, 40 analogous to each other.

The line conductor 19 and the cofacial ground layers 20 are made of a metal material for the high-frequency line conductor, such as Cu, MoMn+Ni+Au (these metals are laminated in this order from below to above on the lower dielectric substrate 15, and hereinafter described in the same manner), W+Ni+Au, Cr+Cu, Cr+Cu+Ni+Au, Ta$_2$N+NiCr+Au, Ti+Pd+Au, or NiCr+Pd+Au, by using a thick film printing method, various thin film forming methods, or a plate processing method. The thicknesses and widths of the components are set in accordance with the frequency of the high-frequency signal to be transmitted and an ideal characteristic impedance.

When the width W19a of the line conductor 19 in the line means where the upper dielectric substrate 16 is joined to the lower dielectric substrate 15 is made smaller than the width W19 of the other portions 19b, 19c of the line conductor 19, the widths W19a, W19 are suitably set in the range from the width W19a corresponding to the ideal characteristic impedance to the line width w19 in the other portions in accordance with the required specifications, namely, so that the line conductor 19 is tapered in the longitudinal direction thereof (left to right direction of FIG. 1A) from the boundaries 41, 42 between the portion 19a and the portions 19b, 19c to the portion 19a of the required width W19a (left to right direction of FIG. 1A), in order to reduce the electromagnetic return. Alternately the width of the line conductor may be reduced stepwise from the boundaries to the line conductor portions 19a of the required width W19a or any other form may be appropriately employed.

In the embodiment of the invention, the line means 38 where the upper dielectric substrate 16 is disposed is configured in such a manner that the end faces 43, 44 of the line conductor 19 in the upper dielectric substrate 16 exist within the ranges of the tapered boundaries 41, 42, respectively. Thereby, even when the arranged position of the upper dielectric substrate 16 is slightly displaced in the longitudinal direction of the line conductor 19, the stripline 38 has a predetermined characteristic impedance Z19a and the transmission mode is kept unoiform, when the end faces 43, 44 exist within the ranges of the tapered boundaries 41, 42, repectively.

The intervals g3, g4 between the line conductor 19 and the cofacial ground layers 20 may be usually set to be standard values which are applied in obtaining a desired characteristic impedance by providing the cofacial ground layers 20. In the case where each of the cofacial ground layers 20 is projected toward the portion 19a of the line conductor 19 by the amounts of projection h1, h2 so as to be disposed at the same intervals (g1=g2, g3=g4) in the first line means 38 which is the joint portion between the upper dielectric substrate 16 and the lower dielectric substrate 15, the amounts of projection h1, h2 or the intervals g1, g2 between the ground layers and the line conductor 19a is adequately set to be $\in_r 15/(2 (\in_r 16))^{1/2}$ or less times the thickness of the lower dielectric substrate 15, in accordance with required characteristics and in consideration of the degree of the above-mentioned effect on the electromagnetic field.

The bottom face ground layer 17 and side face ground layers 18 are formed so as to cover the almost whole of the lower and side faces of the lower dielectric substrate 15 by using the same material as the line conductor 19 and the cofacial ground layers 20, and in the same manner. For example, the thicknesses of the layers are set to be about 20 μm in the case of a thick film, and about 5 μm in the case of a thin film.

In the high-frequency input/output feedthrough of the invention, an upper-face ground layer 75 and side face ground layers 18b may be further disposed on the upper and side faces of the upper dielectric substrate 16. When such layers 75, 18b are disposed, the transmission modes in line means 38 and line means 39, 40 are matched by the functions of the thicknesses d15, d16 of the lower and upper dielectric substrates 15 and 16 and the projected portions 20a1 of the cofacial ground layers 20, so that return and insertion losses can be reduced. Furthermore, this configuration causes the line conductor 19a to be surrounded by the ground layers 20, 18a, 18b, 17, 75, so as to function as a shield against a high-frequency signal.

The bottom face ground layer 17, the side face ground layers 18, or the upper-face layer 18b and side face ground layer 75 of the upper dielectric substrate 16 may be formed as a metal film layer. Alternatively, these layers may be formed by attaching a metal plate or a metal block.

Figure 8:
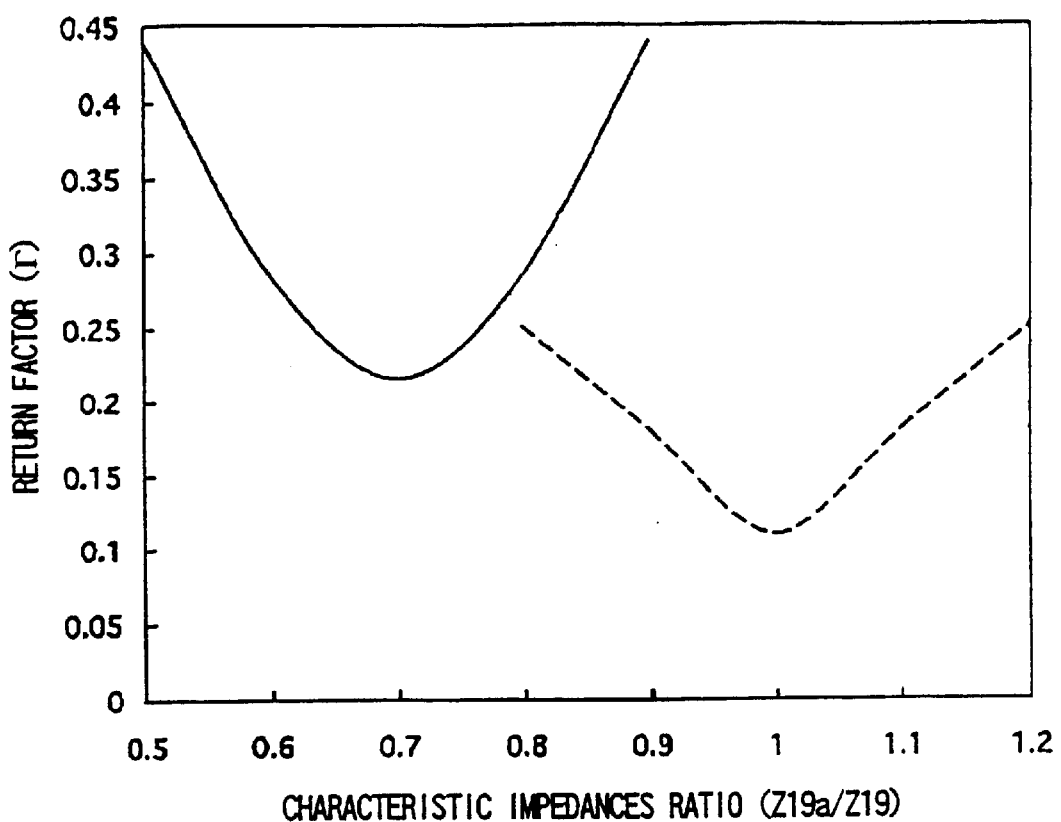
FIG. 8 is a diagram showing the relationship between characteristic impedance ratio and reflection coefficient Γ of line means 38, 39, 49 representing the inventor's experiment results.

Referring to FIG. 8, the result of an experiment carried out by the inventor of the present invention will be described. This experimental result has a constitution described in a later-mentioned first embodiment. It is so constituted that the characteristic impedance Z19 of the line means 39, 40 becomes 50 Ω. The width W19a of the line conductor 19 and the intervals g1, g2 are varied in the later-mentioned embodiment 1 so that the transmission mode of the line means 38 coincides with the transmission modes of the line means 39, 40, and the characteristic impedance Z19a of the line means 38 is determined, and then relationships between a ratio η(=Z19a/Z19) of the characteristic impedances Z19a and Z19, and a reflection coefficient Γ of the transmission signal viewed from the line means 39 toward the line means 38, thereby obtaining a characteristics denoted by a concrete line in FIG. 8. This proved that a ratio η(=Z19a/Z19) of the characteristic impedances at which the reflection coefficient Γ becomes below 0.44 is between 0.5 and 0.9.

$$0.5 \leq Z19a/Z19 \leq 0.9 \quad (3)$$

Therefore, it can be understood that by selecting the thickness d16 of the dielectric substrate 16 to be larger than the thickness d15 of the dielectric substrate 15 (d16>d15) and selecting the width W19a and the intervals g1, g2 so that the characteristic impedance Z19a of the line means 38 becomes below the characteristic impedance Z19 of the line means 39, 40, it is possible to approximate the transmission mode of the line means 38 to the transmission mode of the line means 39, 40. More preferably, the ratio η of the characteristic impedances preferably satisfies the equation (3) as described above.

As is apparent from FIG. 8, a good property can be obtained at the characteristic impedance ratio η of 0.7 at which the reflection coefficient Γ minimum. The characteristic impedance Z19 of the line means 39, 40 is 50 Ω, and the characteristic impedance Z19a of the line means 38 is 35 Ω. This experimental result of FIG. 8 represents a characteristics in a constitution including jigs used in a measurement. The broken line in FIG. 8 represents the characteristics of the conventional high-frequency input/output feedthrough shown in FIG. 20. For the experimental result of the present invention denoted by the concrete line in FIG. 8, frequency of the electromagnetic wave is within the range from 40 to 70 GHz. For the characteristics in the constitution of FIG. 20 which is denoted by the broken line in FIG. 8, frequency of the electromagnetic wave is within the range from 0.45 to 40 GHz.

Next, the package for housing a high-frequency semiconductor element of the invention will be described with reference to the accompanying drawings.

Figure 3:
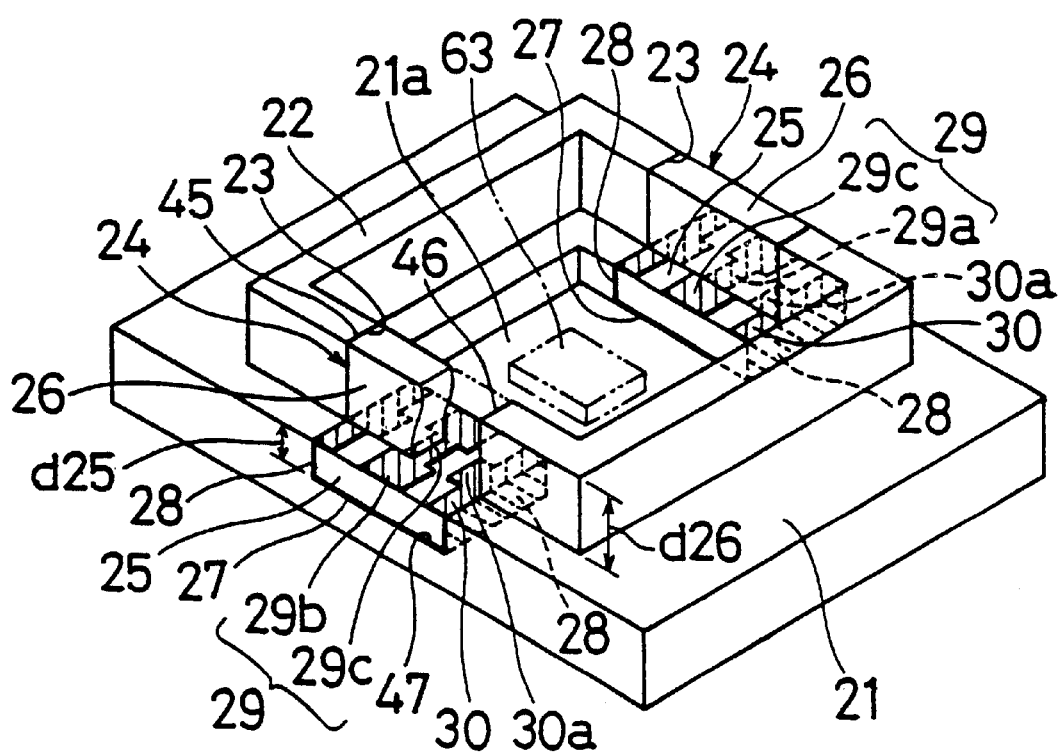
FIG. 3 is a partially cutaway perspective view showing a package for housing a high-frequency semiconductor element of an embodiment of the invention.

FIG. 3 is a partially cutaway perspective view showing an embodiment of the package for housing a high-frequency semiconductor element of the invention.

In FIG. 3, a substrate 21 is made of a dielectric material, a metal or the like. A mounting portion 21a for mounting a high-frequency semiconductor element 63 is formed on the upper face of the substrate. In the embodiment, the mounting portion 21a is formed into a recessed shape. Alternatively, the portion may be formed as a flat face on the substrate 21. A frame 22 is joined onto the substrate 21 so as to surround the mounting portion 21a, and is made of a dielectric, a metal, or the like in the same manner as the substrate 21. An input/output feedthrough attaching portions 23 are formed by cutting away the frame 22, and in which side faces 45, 46 and bottom face 47 thereof are electrically conductive. In the embodiment, similar cutaway portions are formed also in the substrate 21 so as to constitute the input/output feedthrough attaching portions 23. In the case where the substrate 21 and the frame 22 are made of a metal, the side faces 45, 46 and the bottom face 47 of the input/output feedthrough attaching portions 23 are naturally conductive. In the case where the substrate 21 and the frame 22 are made of a dielectric, a conductor layer is formed so as to cover the faces, thereby making the faces conductive. The side faces 45, 46 and the bottom face 47 are grounded via the substrate 21 and the frame 22 or a ground conductor layer (not shown) formed so as to cover the substrates and the frame.

High-frequency input/output feedthroughs 24 of the invention configured as described above are fitted into the input/output feedthrough attaching portions 23. A lower dielectric substrate 25, an upper dielectric substrate 26, a bottom face ground layer 27 which is formed on the bottom face of the lower dielectric substrate 25, side face ground layers 28 which are formed on the side faces, a line conductor 29 which is formed on the upper face of the lower dielectric substrate 25, and cofacial ground layers 30 which are disposed on both the sides of the line conductor 29 with being separated from the line conductor by the same interval. The lower dielectric substrate 25 corresponds to the lower dielectric substrate 15 as shown in FIGS. 1 and 2, the upper dielectric substrate 26 corresponding to the upper dielectric substrate 16 as shown in FIGS. 1 and 2. The bottom face ground layer 27, the side face ground layers 28, and the cofacial ground layers 30 are connected to each other to form a ground face of the same potential. The upper dielectric substrate 26 is joined onto the lower dielectric substrate 25 with sandwiching a portion of the line conductor 29 and a portion of each of the cofacial ground layers 30. A thickness d26 of the upper dielectric substrate 26 is made thicker than a thickness d25 of the lower dielectric substrate 25. The width of the portion 29a of the line conductor 29 which is sandwiched between the lower dielectric substrate 25 and the upper dielectric substrate 26 is made smaller than that of the other portions 29b, 29c (i.e. the portions which are in front and in rear of the upper dielectric substrate 26 and in which the line conductor 29 is exposed), thereby forming a narrow portion 29a. Projected portions 30a like the above described projected portions 20a1 are disposed in the portions of the cofacial ground layers 30 which portions are sandwiched between the lower dielectric substrate 25 and the upper dielectric substrate 26. The projected portions 30a are projected toward the narrow portion 29a of the line conductor 29 with forming the same interval. The bottom face ground layer 27 and the side face ground layers 28 are electrically connected to the conductive side faces 45, 46 and bottom face 47 of the input/output feedthrough attaching portions 23 to be grounded, respectively.

According to the package for housing a high-frequency semiconductor element of the invention, the high-frequency input/output feedthrough parts are structured by using the high-frequency input/output feedthroughs 24 of the invention which are configured as described above. In a transmission of a high-frequency signal between a high-frequency semiconductor element housed in the package and an external electric circuit, therefore, return and insertion losses due to a difference of the transmission modes in the high-frequency input/output feedthroughs 24 are not produced as described above. Consequently, a package for housing a high-frequency semiconductor element which is of the so-called metal wall type (in the case having the metal frame 22), which has excellent transmission characteristics for a high-frequency signal, and which has superior high-frequency characteristics can be obtained.

Terminal electrodes of the high-frequency semiconductor element mounted on the mounting portion 21a, and wiring conductors of external circuits are connected to the line conductors 29 via wires or ribbons so that the high-frequency semiconductor element in the package is electrically connected to the external circuits. A cover 50 which is made of an Fe—Ni alloy such as Fe—Ni—Co, or Fe—Ni 42 alloy, oxygen free copper, aluminum, stainless steel, a Cu—W alloy, a Cu—Mo alloy, or the like is attached to the upper face of the frame 22 by soldering, high-melting metal solder such as AuSn solder, or AuGe solder, seam welding, or the like. As a result, the high-frequency semiconductor element is housed in the package in a hermetically sealed manner, thereby constituting a high-frequency semiconductor device as a product.

In accordance with the specifications of the package, the substrate 21 and the frame 22 are made of the same dielectric as that of the high-frequency input/output feedthroughs 24, and thus in the where these components are made of a dielectric, at least the side faces 45, 46 and bottom face 47 of the input/output feedthrough attaching portions 23 are made electrically conductive. In other embodiment, the substrate 21 may be made of the same metal as that of the metal frame 22.

The substrate 21 and the frame 22 are joined together by one of the high-melting metal solders among AgCu solder, AuSn solder, and AuGe solder. The high-frequency input/output feedthroughs 24 are fitted into the input/output feedthrough attaching portions 23 and joined thereto by similar high-melting metal solder.

Figure 9:
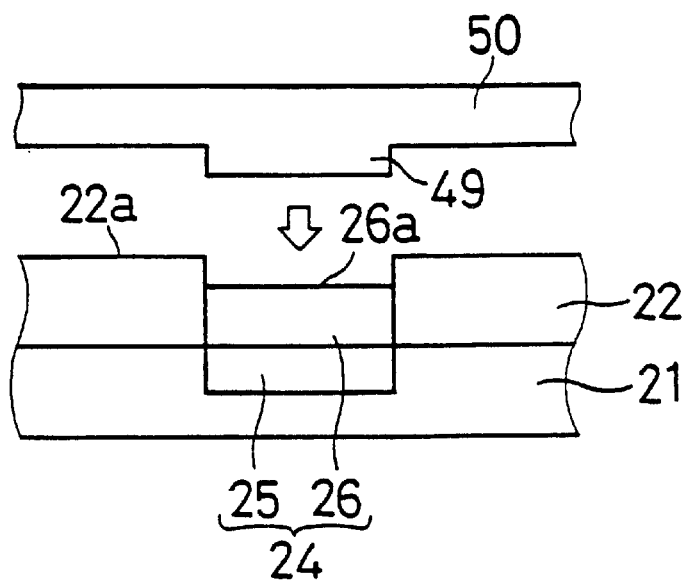
FIG. 9 is a front view showing part of another embodiment of the invention.

In the embodiment, the upper face of the upper dielectric substrate 26 is cofacial with that of the frame 22. According to this configuration, the cover 50 which is made of metal or dielectric may be attached to these upper faces directly or via a frame-like metal seal or the like, thereby enabling the high-frequency semiconductor element mounted on the mounting portion 21a to be easily housed in the package in a hermetically sealed manner. Furthermore, in the case where the upper face 25a of the upper dielectric substrate 26 is not cofacial with the upper face 22a of the frame 22 as shown in FIG. 9 in other embodiment, a cover 50 having a projection 49 which is shaped so as to eliminate the step between the upper faces is used or the attachment is conducted via a metal seal, so that the high-frequency semiconductor element can be similarly housed in the package in a hermetically sealed manner.

Figure 10:
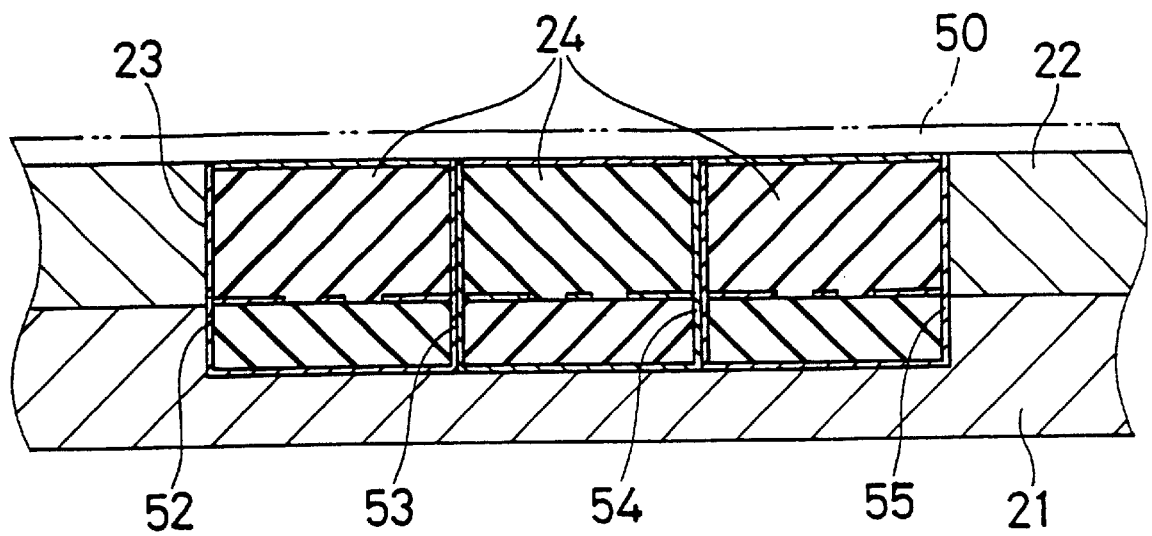
FIG. 10 is a sectional view showing part of another embodiment of the invention.
Figure 11:
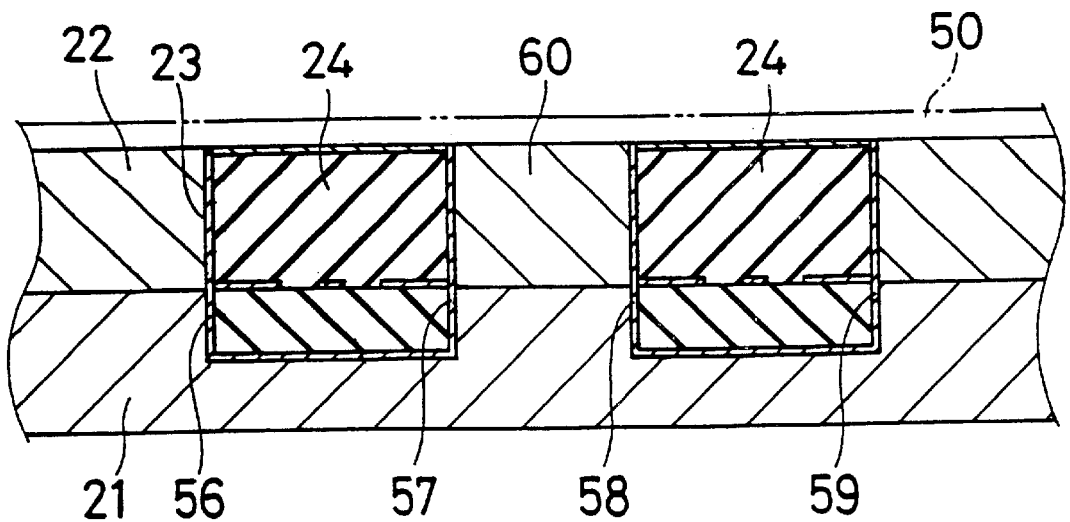
FIG. 11 is a sectional view showing part of still another embodiment of the invention.

In the embodiment of FIG. 3, one high-frequency input/output feedthrough 24 is disposed in each of the sides of the substrate 21. Alternatively, the input/output feedthroughs may be disposed at other positions, or plural input/output feedthroughs may be disposed in one side (3 in FIGS. 10, 2 in FIG. 11) as shown in FIGS. 10 and 11. In such an alternative, plural input/output feedthrough attaching portions 23 are disposed and plural high-frequency input/output feedthroughs 24 are attached in a parallel manner. In FIGS. 10 and 11, the substrate 21 and the frame 22 may be made of dielectric. In the constitution of FIG. 10, on both right and left side faces of the input/output feedthroughs 24, grounded conductive layers 52 to 55 are formed and electrically and hermetically connected using the solders or the like. In the embodiment of FIG. 11, on both side faces of each input/output feedthrough 24, conductive layers 56 to 59 which are grounded, are formed and electrically connected using the solders as described above.

In still another embodiment, the substrate 21 and the frame 22 are made of metal. In this constitution, at both side faces 53, 54 of the adjacent input/output feedthroughs 24, grounded conductive layers are disposed and the other conductive layers 52 and 55 may be omitted. In the embodiment of FIG. 11, the conductive layers 56 to 59 are omitted, and a conductive interface 60 is disposed between the input/output feedthroughs 24 so as to be electrically connected with the substrate 21. Other constitutions in FIGS. 9 to 11 are similar to those of the above described embodiment.

In the package for housing a high-frequency semiconductor element of the invention shown in FIG. 3 also, an upper-face ground layer 75 and side f ace ground layers 18b similar to those in FIG. 1 may be further disposed on the upper and side faces of the upper dielectric substrate 26 of each of the high-frequency input/output feedthroughs 24. When such layers 75; 18b are disposed, the transmission modes are matched by the functions of the thicknesses d25, d26 of the lower and upper dielectric substrates 25 and 26 and the projected portions 30a of the cofacial ground layers 30, so that return and insertion losses can be reduced. Furthermore, this configuration causes the line conductor 29a to be surrounded by the ground layers, so as to function as a shield against a high-frequency signal.

Figure 12:
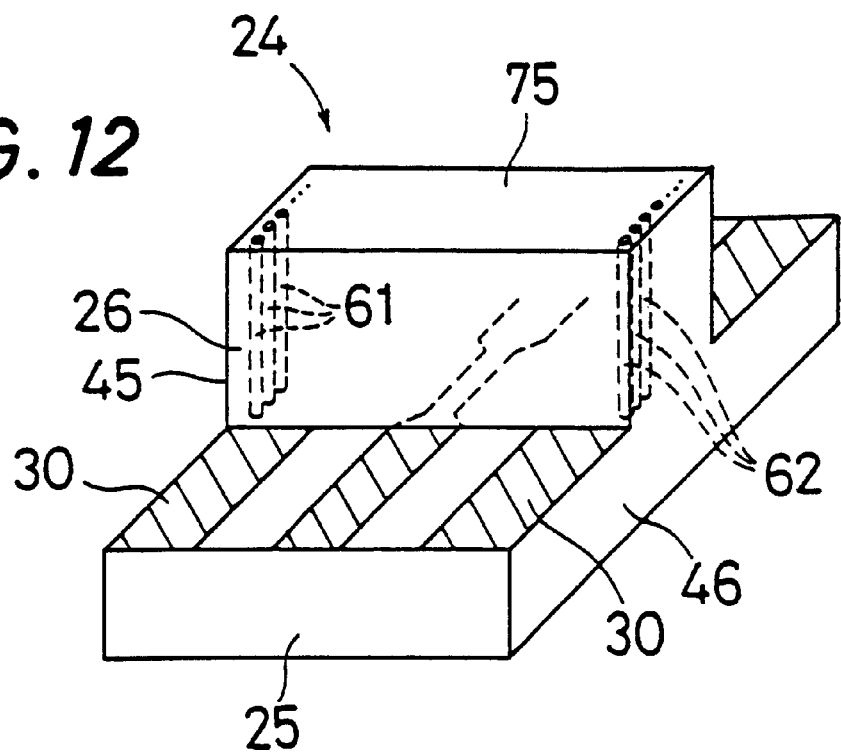
FIG. 12 is a perspective view showing an input/output feedthrough 24 of another embodiment of the invention.
Figure 13:
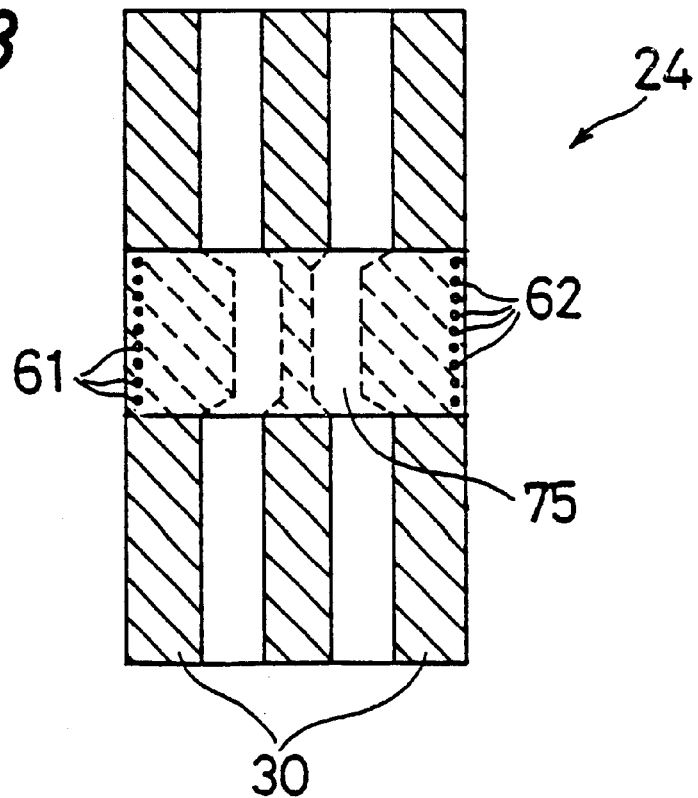
FIG. 13 is a plane view showing part of the embodiment shown in FIG. 12.

The bottom face ground layer 27, the side face ground layers 28, and the side face ground layers 18b and upper-face ground layer 75 of the upper dielectric substrate 26 (cf. FIG. 1) may be formed as a metal film layer. Alternatively, in the input/output feedthroughs 24 shown in FIG. 12, for electrically connecting the cofacial ground layer 30 with the upper-face ground layer of the upper dielectric substrate 26, the layers may be configured as a substantially continuous ground layer by arranging a number of through conductors 61, 62 in the upper dielectric layer 26 as shown in FIG. 12 or connecting the conductors, so as to function in the same manner as a film layer, or by attaching a metal plate or a metal block. FIG. 13 is a simplified plane view showing the embodiment in FIG. 12.

Figure 4:
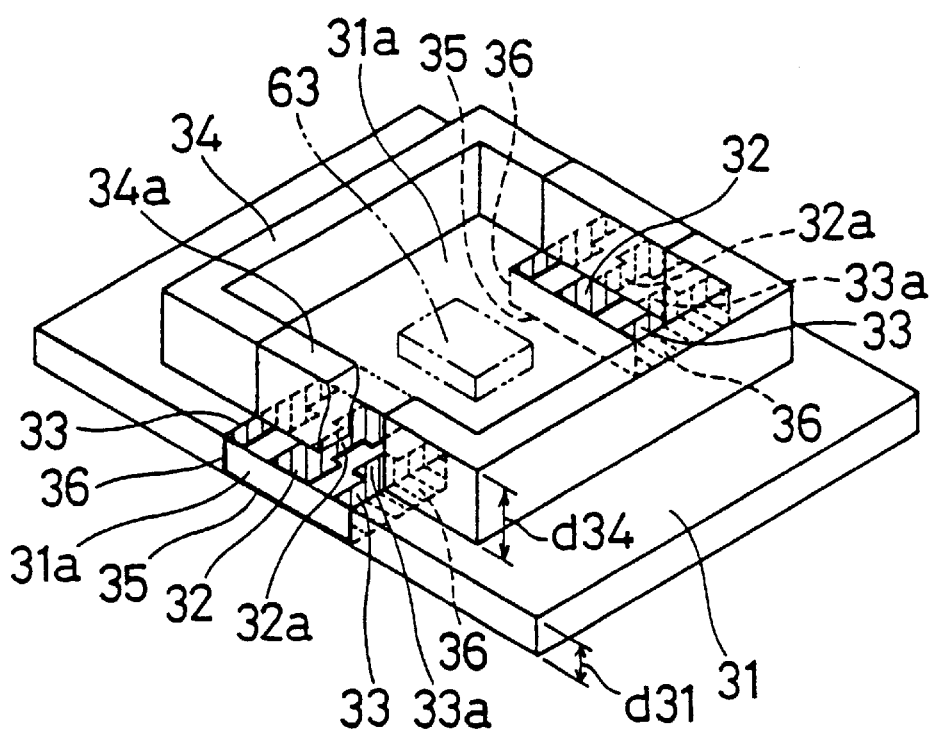
FIG. 4 is a partially cutaway perspective view showing a package for housing a high-frequency semiconductor element of another embodiment of the invention.

FIG. 4 is a partially cutaway perspective view showing another embodiment of the package for housing a high-frequency semiconductor element of the invention.

Referring to FIG. 4, a dielectric substrate 31 is made of the same material as that of the above-mentioned lower dielectric substrate 15 or upper dielectric substrate 16. A mounting portion 31a for mounting a high-frequency semiconductor element 63 is formed in the upper face of the substrate. In the embodiment, the mounting portion 31a is formed into a flat face. Alternatively, the portion may be formed as a recessed shape. A line conductor 32 is formed on the upper face of the dielectric substrate 31 so as to elongate from the vicinity of the mounting portion 31a to the vicinity of the outer periphery of the dielectric substrate 31. Cofacial ground layers 33 are disposed on both the sides of the line conductor 32 with being separated from the line conductor by the same interval. A dielectric frame 34 is joined onto the dielectric substrate 31 so as to surround the mounting portion 31a with sandwiching a portion of the line conductor 32 and a portion of each of the cofacial ground layers 33. A bottom face ground layer 35 is formed on the bottom face of the dielectric substrate 31 so as to oppose the line conductor 32 and the cofacial ground layers 33. Connecting conductor layers 36 through which the bottom face ground layer 35 is connected to the cofacial ground layers 33 correspond to the above-mentioned side face ground layers 18, 28.

In the package for housing a high-frequency semiconductor element of the invention, the thickness d34 of the dielectric frame 34 is larger than the thickness d31 of the dielectric substrate 31 (d34>d31), and the width of the portion 32a of the line conductor 32 which is sandwiched between the dielectric substrate 31 and the dielectric frame 34 is smaller than the width of the other portion the other portions (i.e. the portions which are in front and in rear of the dielectric frame 34 and in which the line conductor 32 is exposed,) thereby forming a narrow portion 32a. Projected portions 33a are disposed in the portions of the cofacial ground layers 33 which portions are sandwiched between the dielectric substrate 31 and the dielectric frame 34. The projected portions are projected toward the narrow portion 32a of the line conductor 32 with forming the same interval. In the above embodiment, the input/output feedthroughs are constituted so as to be laterally symmetric (vertically symmetric in FIG. 1A) with respect to a plane which includes the cutting plane line IV—IV and orthogonal to the paper plane of FIG. 1A. Alternatively, the in other embodiment of the invention, the input/output feedthrough may be asymmetrical, that is, it may becomes that g1≠g2 and g3≠g4.

According to the thus configured package for housing a high-frequency semiconductor element of the invention, with respect to the portion 32a of the line conductor 32 in which the width is reduced in order to attain the matching of the characteristic impedance in each of the high-frequency input/output feedthroughs by the conventional design, the dielectric frame 34 is thicker than the dielectric substrate 31, and the projected portions 33a are disposed in the cofacial ground layers 33 which are formed on both the sides of the line conductor 32 with forming the same interval, so as to be projected toward the portion 32a of the line conductor 32 with forming the same interval. In the side of the dielectric substrate 31, therefore, the electric field of the high-frequency signal is concentrated toward the bottom face ground layer 35 and the cofacial ground layers 33 as shown in FIG. 2A. In the side of the dielectric frame 34, the transmission of the electric field can be substantially eliminated. The electric field distribution can be shaped into the quasi-TEM mode. In other words, the electric field distribution can be made closer to the quasi-TEM mode which is the electric field distribution like FIG. 2B in the portions of the line conductor 32 other than the portion 32a sandwiched between the dielectric substrate 31 and the dielectric frame 34, i.e., the portions which are in front and in rear of the dielectric frame 34 and in which the line conductor 32 is exposed. As a result, the transmission modes in the line conductor 32 can be matched with each other. Even when a difference in characteristic impedance occurs in the portion 32a of the line conductor 32 which is sandwiched between the dielectric substrate 31 and the dielectric frame 34, return and insertion losses due to the difference of the transmission modes are not produced, with the result that a package for housing a high-frequency semiconductor element which is of the so-called ceramic wall type (in the case of ceramic frame 34), which has excellent transmission characteristics for a high-frequency signal, and which has superior high-frequency characteristics can be obtained.

Terminal electrodes of the high-frequency semiconductor element 63 mounted on the mounting portion 31a, and wiring conductors of external circuits are connected to the line conductors 32 via wires or ribbons so that the high-frequency semiconductor element in the package is electrically connected to the external circuits. A cover which is made of the above-mentioned material is attached to the upper face of the dielectric frame 34 by the above-mentioned attaching method. As a result, the high-frequency semiconductor element 63 is housed in the package in a hermetically sealed manner, thereby constituting a high-frequency semiconductor device as a product.

In accordance with the specifications of the package, the dielectric substrate 31 and the dielectric frame 34 are made of the same dielectric as that of the high-frequency input/output feedthroughs 24. From the viewpoint that the bottom face ground layer 35 is required to be the ideal grounded state, it is preferable to form a ground layer on the bottom face of the dielectric substrate 31 in the same manner as the bottom face ground layer 35.

The dielectric substrate 31 and the dielectric frame 34 are joined together by, for example, stacking ceramic green sheets which will be respectively formed into the dielectric substrate 31 and the dielectric frame 34 as a result of firing, and then firing the sheets to be integrated. The line conductors 32, the cofacial ground layers 33, the bottom face ground layer 35, and the connecting conductor layers 36 are formed so as to cover the dielectric substrate 31, by, for example, applying or embedding conductor paste of a predetermined pattern to the dielectric substrate 31 and then firing the paste so as to be integrated with the dielectric substrate 31.

In the embodiment, the portion of the dielectric frame 34 which corresponds to the upper dielectric substrate 16 of the high-frequency input/output feedthrough part is integrated with the dielectric frame 34 so that the upper face of the portion is cofacial with that of the dielectric frame 34. According to this configuration, a cover (reference numeral 50 in above described FIGS. 9 to 11) may be attached to these upper faces directly or via a frame-like metal seal or the like, thereby enabling the high-frequency semiconductor element mounted on the mounting portion 31a to be housed in the package in a hermetically sealed manner. As described above, even when a step corresponding to the projection 49 exists as in above described FIG. 9, there arises no problem.

The dielectric constant of the portion 34a corresponding to the upper dielectric substrate (reference numeral 26 described above) may be made different from or, for example, smaller than that of the other portion of the dielectric frame 34, whereby the transmission modes for a high-frequency signal can be made further closer as described above. Therefore, the return and insertion losses can be effectively reduced.

The mounting portion 31a of the dielectric substrate 31 corresponds to the lower dielectric substrate 15 as shown in FIGS. 1 and 2, the mounting portion 34a of the dielectric frame 34 corresponding to the upper dielectric substrate 16 as shown in FIGS. 1 and 2.

In the embodiment, one high-frequency input/output feedthrough part is disposed in each of the sides of the dielectric substrate 31, respectively. Alternatively, the input/output feedthrough parts may be disposed in other positions, or plural input/output feedthrough parts may be disposed in one side as shown above in FIGS. 10 and 11.

In the package for housing a high-frequency semiconductor element of the invention also, an upper-face ground layer (see 75 described above) and side face ground layers (see 18b described above) may be further disposed on the upper and side faces of the dielectric frame 34 corresponding to the upper dielectric substrate of each of the high-frequency input/output feedthrough parts. When such layers are disposed, the transmission modes are matched by the functions of the thicknesses of the dielectric substrate 31 and the dielectric frame 34 which are vertically stacked, and the projected portions 33a of the cofacial ground layers 33, so that return and insertion losses can be reduced. Furthermore, this configuration causes the line conductor 32a to be surrounded by the ground layers, so as to function as a shield against a high-frequency signal.

The bottom face ground layer 35, the connecting conductor layers 36, and the side face and upper-face ground layers of the dielectric frame 34 may be formed as a metal film layer. Alternatively, the layers may be configured as a substantially continuous ground layer by arranging a number of through conductors 61, 62 in the same manner as in FIGS. 12 and 13 described above or connecting the conductors, so as to function in the same manner as a film layer, or by attaching a metal plate or a metal block.

Hereinafter, specific examples of the invention will be described.

EXAMPLE 1

In the embodiment of FIGS. 1 and 2, by using a ceramic forming method in which so-called cosintering is conducted by the ceramic green sheet multilayer technique, the following high-frequency input/output feedthrough was produced. The upper dielectric substrate 16 in which length×width×thickness is 1.5 mm×1.0 mm×0.2 mm and which is made of alumina (the specific dielectric constant $\in_r$=9.8) is Joined onto the lower dielectric substrate 15 in which length×width×thickness is 0.5 mm×1.0 mm×0.51 mm and which is made of alumina. The bottom face ground layer 17 and the side face ground layers 18 which are made of W of a thickness of about 10 μm and Ni+Au plating of a thickness of about 2 to 6 μm are formed on the lower and side faces of the lower dielectric substrate 15. The line conductor 19 made of the same material, and the cofacial ground layers 20 which are disposed on both the sides of the line conductor 19 with being separated from the line conductor 19 by the same interval are formed on the upper face of the substrate. The width W19a of the portion 19a (narrow portion) of the line conductor 19 which is sandwiched between the lower and upper dielectric substrates 15, 16 is 0.15 mm, and the width W19 of the other portions 19b, 19c, i.e. the portions which are in front and in rear of the upper dielectric substrate 16 and in which the line conductor 19 is exposed is 0.20 mm. Projected portions 20a1 are disposed in the portions of the cofacial ground layers 20 which portions 20a1 are sandwiched between the lower dielectric substrate 15 and the upper dielectric substrate 16. The projected portions are projected toward the narrow portion 19a of the line conductor 19 with forming the same interval. The interval (g1=g2) for the portions is 0.265 mm, and the interval (g3=g4) of the other portions 19b, 19c (i.e. the portions which are in front and in rear of the upper dielectric substrate 16 and in which the line conductor 19 is exposed) is 0.30 mm. As a result, a high-frequency input/output feedthrough A which is the high-frequency input/output feedthrough of the invention was obtained.

As a high-frequency input/output feedthrough of a comparison example, a high-frequency input/output feedthrough B was obtained in the same manner as described above except the followings. Alumina of a thickness of 0.38 mm is used as the upper dielectric substrate. The width of the portion (narrow portion) of the line conductor which is sandwiched between the lower and upper dielectric substrates is 0.08 mm. No projected portions are disposed in the portions of the cofacial ground layers which portions are sandwiched between the lower dielectric substrate and the upper dielectric substrate. The interval between the portions and the line conductor (narrow portion) is 0.36 mm.

Figure 5:
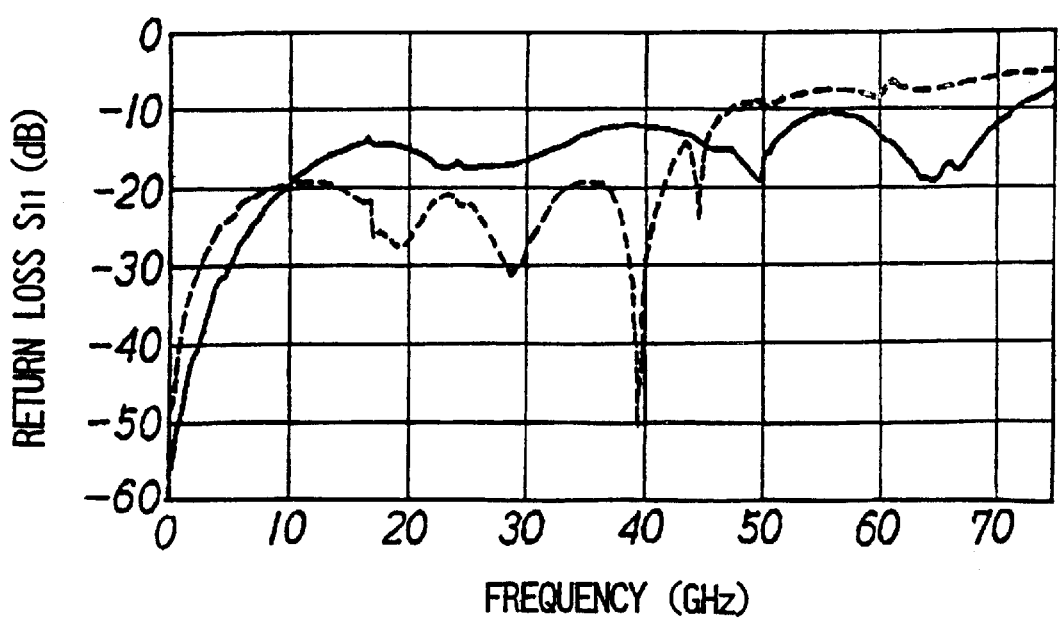
FIG. 5 is a diagram showing frequency characteristics of return loss in a high-frequency input/output feedthrough.
Figure 6:
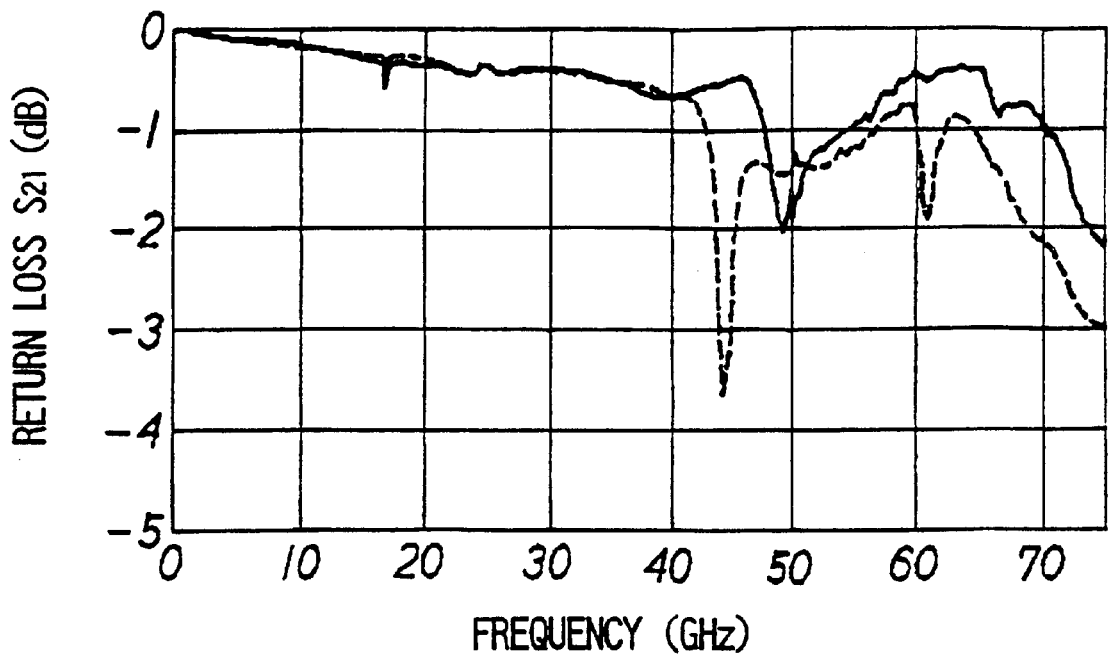
FIG. 6 is a diagram showing frequency characteristics of insertion loss in a high-frequency input/output feedthrough.
Figure 7:
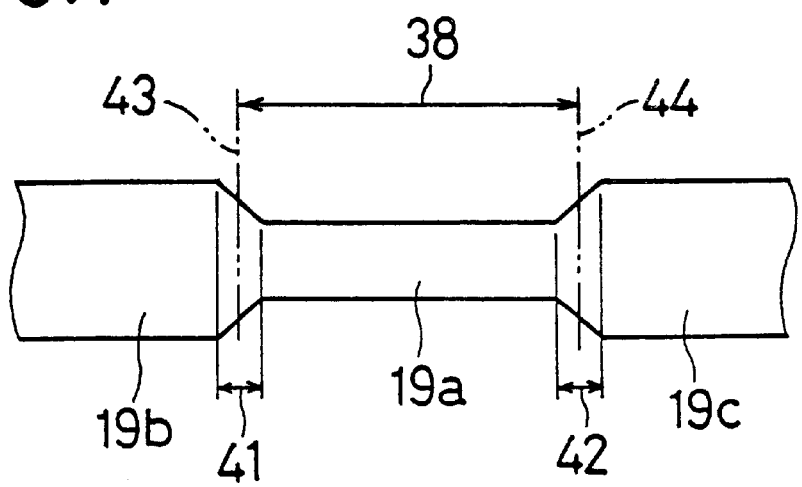
FIG. 7 is a schematic plane view showing part of the high-frequency input/output feedthrough as shown in FIGS. 1 and 2.

The high-frequency input/output feedthroughs A and B were applied to an input/output portion of a package for housing a high-frequency semiconductor element. The return loss ($S_{11}$) in the frequency region of 0 to 70 GHz was measured by a usual measuring method to obtain the frequency characteristics of the return loss. Similarly, the amount of the insertion loss ($S_{21}$) was measured in the form of an insertion loss by a usual measuring method as an evaluation index of the transmitted amount in the input signal, thereby obtaining the frequency characteristics of the insertion loss. The results of these measurements are shown in the graphs of FIGS. 5 and 6. FIG. 5 shows the frequency characteristics of the return loss, and FIG. 6 shows the frequency characteristics of the insertion loss. In FIG. 5, the abscissa indicates the frequency (unit: GHz), the ordinate indicates the return loss $S_{11}$ (unit: dB), and the characteristic curves of the high-frequency input/output feedthroughs A and B are indicated by the solid line and the broken line, respectively. In FIG. 6, the abscissa indicates the frequency (unit: GHz), the ordinate indicates the insertion loss $S_{21}$ (unit: dB), and the characteristic curves of the high-frequency input/output feedthroughs A and B are indicated by the solid line and the broken line, respectively.

From the results shown in FIGS. 5 and 6, it will be seen that, in the high-frequency input/output feedthrough B, excellent high-frequency characteristics were observed in the frequency range lower than 40 GHz but the characteristics are remarkably impaired in the millimeter wave region, particularly in the frequency range higher than 40 GHz. By contrast, it will be seen that, in the high-frequency input/output feedthrough A, excellent return and transmission characteristics were realized even in the frequency range higher than 40 GHz because the transmission modes in the line conductor are matched with each other.

From the above, it was ascertained that, in the high-frequency input/output feedthrough of the invention, return and insertion losses due to a difference of the transmission modes are reduced and excellent transmission characteristics for a high-frequency signal can be obtained.

Figure 14:
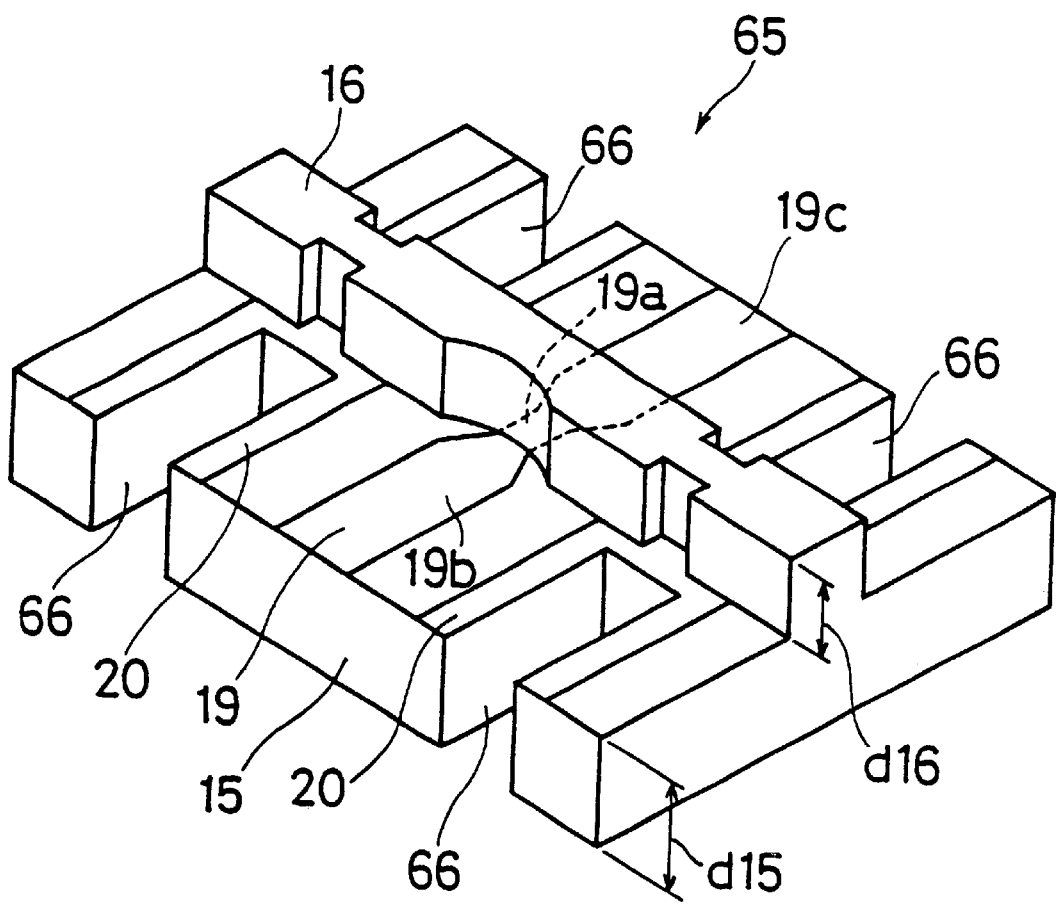
FIG. 14 is a perspective view showing an input/output feedthrough 65 of another embodiment of the invention.
Figure 15:
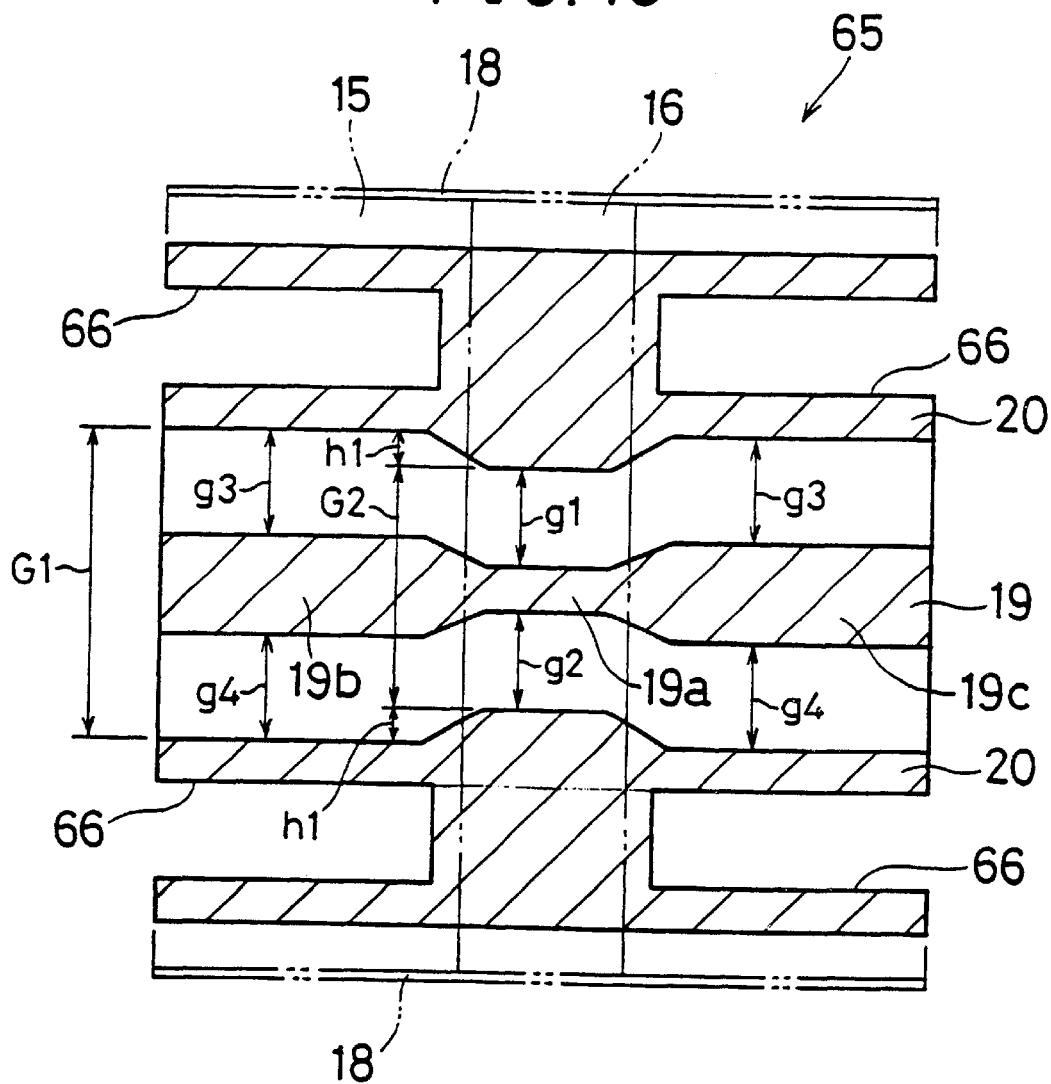
FIG. 15 is a simplified plane view showing the input/output feedthrough 65 shown in FIG. 14.

FIG. 14 is a perspective view of a high-frequency input/output feedthrough 65 of still another embodiment of the invention, and FIG. 15 is a plane view of the high-frequency input/output feedthrough 65. The high-frequency input/output feedthrough 65 shown in FIGS. 14 and 15 is similar to the input/output feedthrough described above in relation to FIGS. 1 and 2, and corresponding elements are denoted by the same reference numerals. On the lower dielectric substrate 15, the elongated line conductor 19 is formed, and the cofacial ground layer 20 is formed at each side in the longitudinal direction of the line conductor 19. In the lower dielectric substrate 15, a notch 66 is formed at each position corresponding to the cofacial ground layer 20 along the longitudinal direction of the line conductor 19. On an inner circumference of the notch 66, a conductive layer which is electrically connected with the cofacial ground layer 20 is formed. On the lower dielectric substrate 15, the upper dielectric substrate 16 is formed across the line conductor 19 and the cofacial ground layer 20.

Figure 16A:
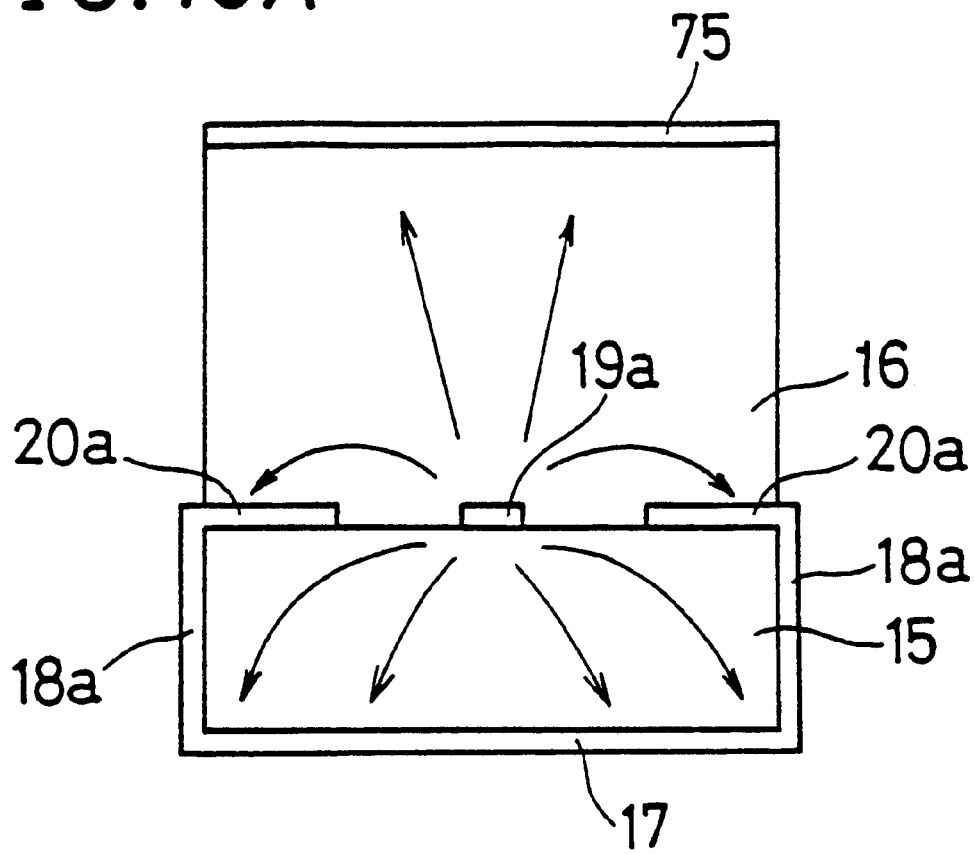
FIGS. 16A and 16B are sectional views showing electric field distribution of the input/output feedthrough 65.
Figure 16B:
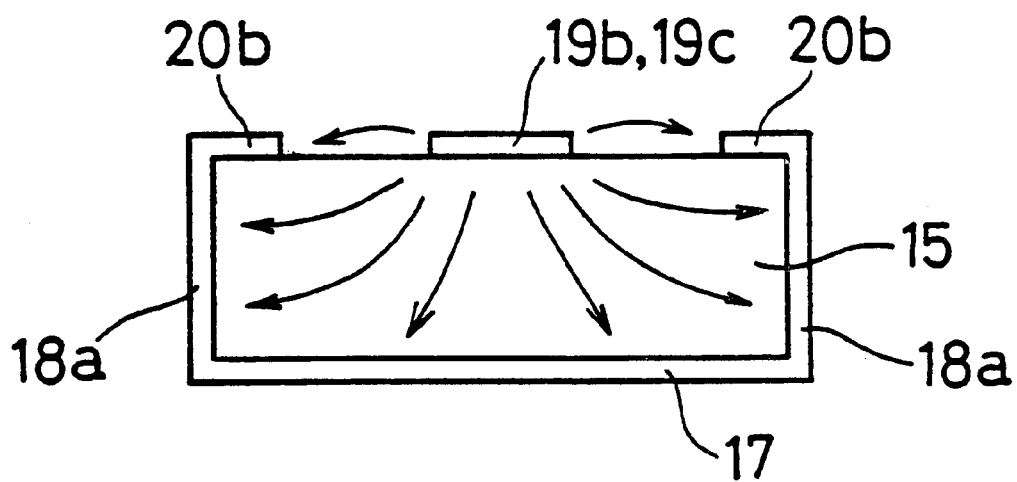

The electric field distribution of the input/output feedthrough shown in FIGS. 14 and 15 is shown in FIGS. 16A and 16B. FIGS. 16A and 16B corresponds to above FIGS. 2A and 2B, respectively. The electric field distribution shown in FIG. 16A shows a transmission mode in which the transmission mode formed at the joint portion between the lower dielectric substrate 15 and the upper dielectric substrate 16 is close to the quasi-TEM mode, and approximates to the quasi-TEM mode at the portion of the lower dielectric substrate 15 in which the upper dielectric substrate 16 is not formed, as shown in FIG. 16.

Figure 17:
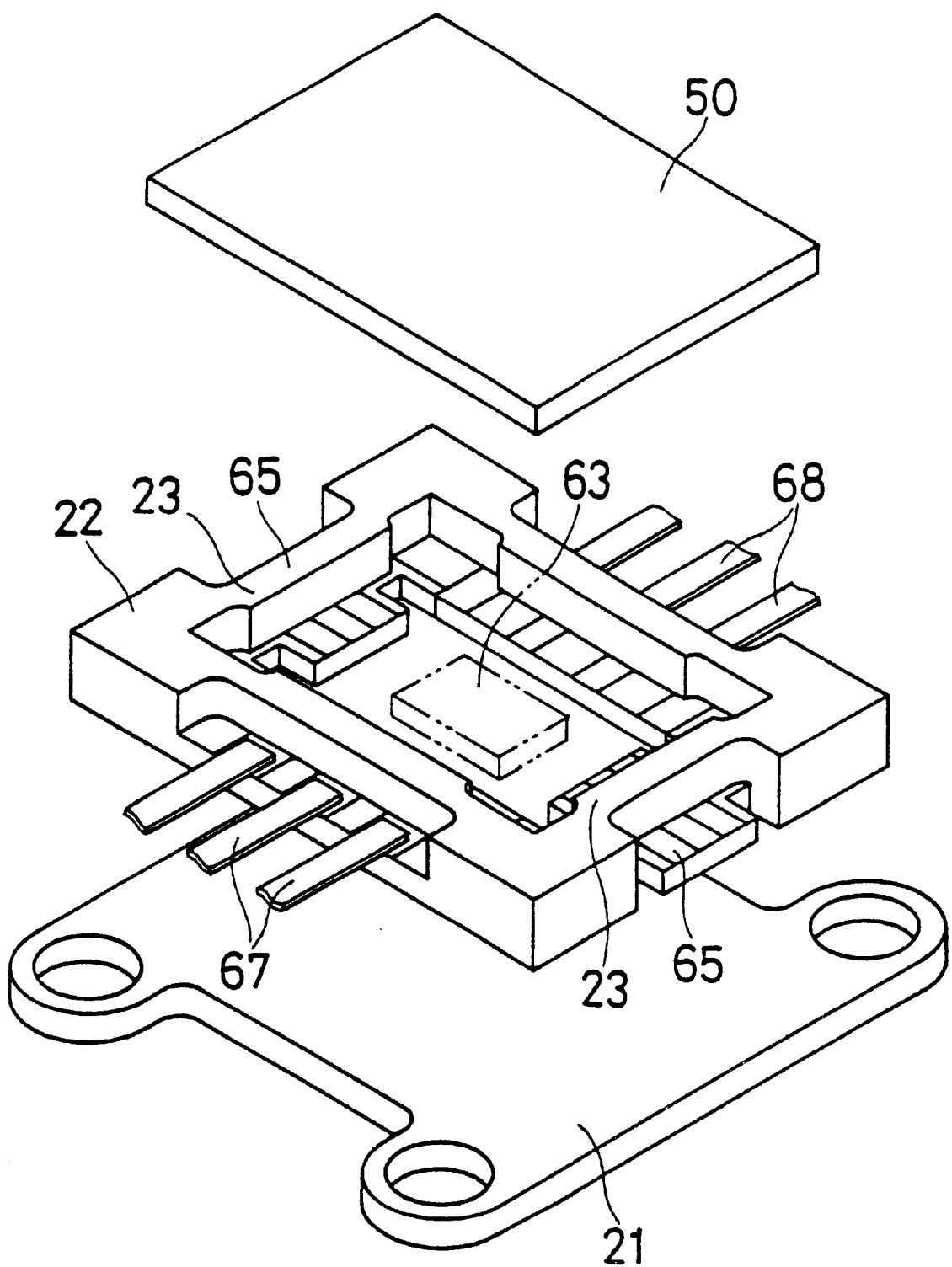
FIG. 17 is an exploded perspective view showing a semiconductor apparatus provided with the input/output feedthrough 65 shown in FIGS. 14 and 15.
Figure 19A:
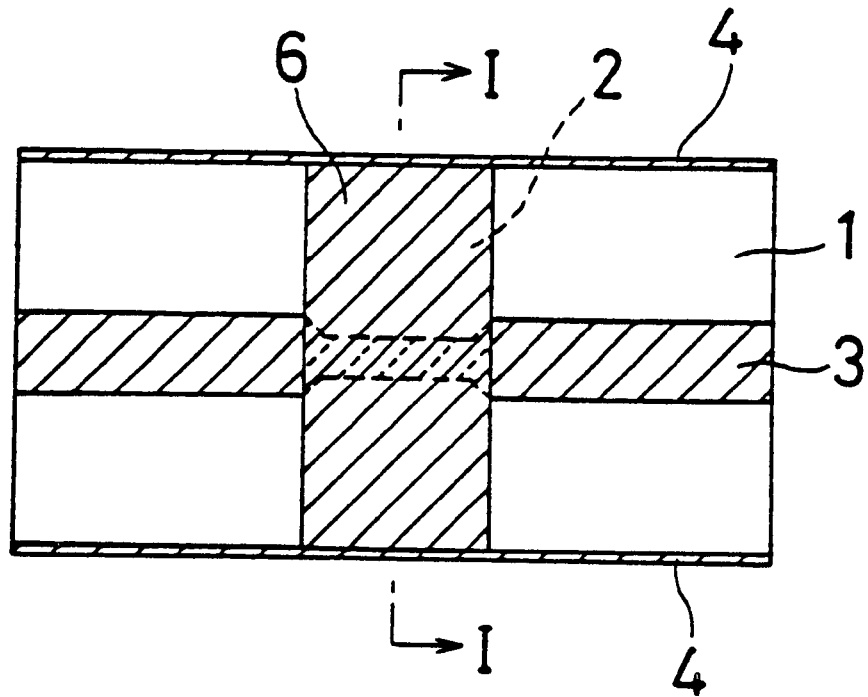
FIG. 19A is a plane view showing an example of a prior art high-frequency input/output feedthrough and FIG. 19B is a sectional view taken along line I—I of FIG. 19A.
Figure 19B:
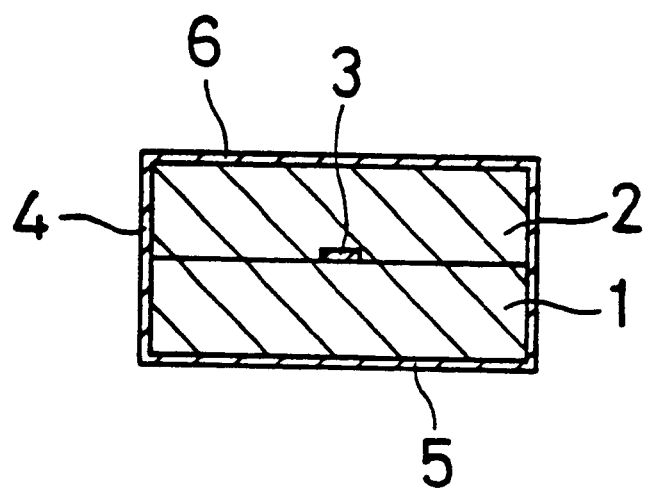

FIG. 17 is an exploded perspective view showing an entire constitution of a semiconductor device using the input/output feedthrough 65 shown in FIG. 14 which is simplified, and FIG. 18 is a longitudinal section view of the same. This embodiment is similar to the embodiment shown in FIGS. 3 and 4, and the corresponding elements are denoted by the same reference numerals. On the metal substrate 21, the frame 22 made of dielectric is disposed, and at the feedthrough attaching portion 23 of the frame 22, the input/output feedthrough 65 is disposed. Further, lines 67, 68 for transmitting direct current power and direct current signal are disposed in the frame 22. The semiconductor element 63 is attached on the substrate 21 in the frame 22. The semiconductor element 63 is connected to the input/output feedthrough 65. The semiconductor element 63 may be MMIC (Microwave Monolisic Integrated Circuit), for example. Other constitutions are similar to those of the above-mentioned embodiments.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing a high frequency semiconductor element comprising:
   a substrate made of a dielectric or metal, having one surface including a mounting portion on which the high-frequency semiconductor element is mounted;

a frame made of a dielectric or metal, joined to the substrate so as to enclose the mounting portion, the frame being notched to form an input/output feedthrough mounting portion whose side faces and bottom face are electrically conductive;

a high-frequency input/output feedthrough fitted to the input/output feedthrough mounting portion; and a cap attached to a top face of the frame, wherein the high-frequency input/output feedthrough comprising:

a) a first dielectric substrate;

b) a high-frequency transmission line of narrow width extending on a first surface of the first dielectric substrate, the high-frequency transmission line having a first high-frequency transmission line portion and second high-frequency transmission line portions extending from both longitudinal ends of the first high-frequency transmission line portion, respectively;

c) a pair of first ground conductors of narrow width extending on the first surface of the first dielectric substrate, the first ground conductors being spaced from both width direction sides of the high-frequency transmission line, respectively, each of the first ground conductors having a first ground conductor portion extending along the first high-frequency transmission line portion and second ground conductor portions extending from both longitudinal ends of the first ground conductor portion along the second high-frequency transmission line portions respectively;

d) a second dielectric substrate for hermetic sealing, overlaid on the first surface of the first dielectric substrate so as to cover the first high-frequency transmission line portion and the first ground conductor portions; and e) a second ground conductor formed on a second surface of the first dielectric substrate opposite the first surface thereof, the second ground conductor overlapping a region including the high-frequency transmission line, the first ground conductors, and gaps having widths between the high-frequency transmission line and the first ground conductors when viewed in a direction perpendicular to the first surface of the first dielectric substrate, the second ground conductor constituting first line means together with the first high-frequency transmission line portion, the first ground conductor portions and the first and second dielectric substrates and constituting second line means together with the second high-frequency transmission line portion, the second ground conductor portions and the first dielectric substrate, wherein:

f) a first width of the first high-frequency transmission line portion is smaller than a second width of the second high-frequency transmission line portions, g) a thickness of the second dielectric substrate is selected to be larger than a thickness of the first dielectric substrate, and the first width and the regions between the first high-frequency transmission line portion and the first ground conductors are selected so that a characteristic impedance of the first line means is smaller than a characteristic impedance of the second line means, in order to make approximation of a transmission mode of the first line means to a transmission mode of the second line means.

2. The package for housing a high-frequency semiconductor element of claim 1, wherein a first distance between the first ground conductor portions on both sides of the first high-frequency transmission line portion in the width direction of the first ground conductor portions is equal to or smaller than a second distance between the second ground conductor portions on both sides of the second high-frequency transmission line portion.

3. The package for housing a high-frequency semiconductor element of claim 1 or 2, wherein the first width and first gaps in the high-frequency input/output feedthrough are selected so that a ratio of the characteristic impedance of the first line means to the characteristic impedance of the second line means meets the following relationship: $0.5 \leq Z19a/Z19 \leq 0.9$.

4. A package for housing a high frequency semiconductor element comprising:

a substrate made of a dielectric or metal, having one surface including a mounting portion on which the high-frequency semiconductor element is mounted;

a frame made of a dielectric or metal, joined to the substrate so as to enclose the mounting portion, the frame being notched to form an input/output feedthrough mounting portion whose side faces and bottom face are electrically conductive;

a high-frequency input/output feedthrough fitted to the input/output feedthrough mounting portion; and a cap attached to a top face of the frame, wherein the high-frequency input/output feedthrough comprising:

a first dielectric substrate having one surface where a line conductor and cofacial ground layers spaced at a same distance from both sides of the line conductor are formed, the other surface where a bottom face ground layer is formed, and side faces where side ground layers are formed; and a second dielectric substrate joined to the one surface of the first dielectric substrate so as to sandwich portions of the line conductor and the cofacial ground layers between the first and second substrates, wherein the second dielectric substrate i s made thicker than the first dielectric substrate, the portion of the line conductor sandwiched between the first and second substrates is made narrower than the other portions thereof in width, and the portions of the cofacial ground layers sandwiched between the first and second substrates project toward the line conductor uniformly in a longitudinal direction of the line conductor so as to be spaced at a same distance from both sides of the line conductor.

5. The package for housing a high-frequency semiconductor element of claim 4, wherein the first dielectric substrate of the high-frequency input/output feedthrough has a dielectric constant $\in_r 15$ and a thickness, and a thickness of the second dielectric substrate having a dielectric constant $\in_r 16$ is $\in_r 15/(2\sqrt{\in_r 16})$ or more times the thickness of the first dielectric substrate.

6. The package for housing a high-frequency semiconductor element of claim 4, wherein the thickness of the second dielectric substrate of the high-frequency input/output feedthrough is $\in_r 15/(\sqrt{\in_r 16})$ or more times the thickness of the first dielectric substrate.

7. The package for housing a high-frequency semiconductor element of claim 1 or 4, wherein heights of the projections toward the line conductor of the high-frequency input/output feedthrough, of the portions of the cofacial ground layers sandwiched between the first and second dielectric substrates or the gaps between the line conductor and the cofacial ground layers are $\epsilon_r 15/(2\sqrt{\epsilon_r 16})$ or less times the thickness of the first dielectric substrate.

8. The package for housing a high-frequency semiconductor element of claim 1 or 4, wherein the dielectric constant $\epsilon_r 15$ of the first dielectric substrate of the high frequency input/output feedthrough is smaller than the dielectric constant $\epsilon_r 16$ of the second dielectric substrate.

9. The package for housing a high-frequency semiconductor element of claim 1 or 4, wherein an upper ground layer of the high-frequency input/output feedthrough is provided on a surface of the second dielectric substrate of an opposite side to the first dielectric substrate, and side ground layers are provided on side faces of the second dielectric substrate.

10. The package for housing a high-frequency semiconductor element of claims 1 or 4, wherein the first and second dielectric substrate of the high-frequency input/output feedthrough are made of one or more materials selected from the group consisting of alumina, mullite, glass ceramics, polytetrafluoroethylene (PTFE), glass epoxy resins and polyimides.

11. The package for housing a high-frequency semiconductor element of claim 1 or 4, wherein the line conductor and the cofacial ground layers of the high-frequency input/output feedthrough are made of one or more materials selected from the group consisting of Cu, MoMn+Ni+Au, W+Ni+Au, Cr+Cu, Cr+Cu+Ni+Au, Ta$_2$N+NiCr+Au, Ti+Pd+Au, and NiCr+Pd+Au.

12. A package for housing a high-frequency semiconductor element comprising:
    a dielectric substrate having one surface including a mounting portion on which the high-frequency semiconductor element is mounted;
    a line conductor formed from a proximity of the mounting portion to a proximity of a periphery of the dielectric substrate on the one surface of the dielectric substrate;
    first ground layers arranged from a proximity of the mounting portion to a proximity of a periphery of the dielectric substrate on the one surface of the dielectric substrate so as to be spaced at a same distance from both sides of the line conductor;
    a dielectric frame joined to the one surface of the dielectric substrate so that the mounting portion is enclosed by the dielectric frame and portions of the line conductor and the first ground layers are sandwiched between the dielectric substrate and the dielectric frame;
    a second ground layer formed on the other surface of the dielectric substrate; and
    a connecting conductor layer for connecting the second ground layer to the first ground layers,
        wherein the dielectric frame is made thicker than the dielectric substrate,
        the portion of the line conductor sandwiched between the dielectric substrate and the dielectric frame is made narrower than the other portions thereof in width, and the portions of the first ground layers sandwiched between the dielectric substrate and the dielectric frame project toward the line conductor so as to be spaced at a same distance from both sides of the line conductor uniformly in a longitudinal direction of the line conductor.

13. The package for housing a high-frequency semiconductor element of claim 12, wherein the dielectric substrate has a dielectric constant $\epsilon_r 15$ and a thickness, and a thickness of the dielectric frame having a dielectric constant $\epsilon_r 16$ is $\epsilon_r 15/(2\sqrt{\epsilon_r 16})$ or more times the thickness of the dielectric substrate.

14. The package for housing a high-frequency semiconductor element of claim 12 or 13, wherein the thickness of the dielectric frame is $\epsilon_r 15/(\sqrt{\epsilon_r 16})$ or more times the thickness of the dielectric substrate.

15. The package for housing a high-frequency semiconductor element of claim 12 or 13, wherein heights of the projections toward the line conductor, of the portions of the first ground layers sandwiched between the dielectric substrate and the dielectric frame, or the gaps between the line conductor and the first ground layers are $\epsilon_r 15/(2\sqrt{\epsilon_r 16})$ or less times the thickness of the first dielectric substrate.

16. The package for housing a high frequency semiconductor element of claim 12 or 13, wherein the dielectric constant $\epsilon_r 15$ of the dielectric substrate is smaller than the dielectric constant $\epsilon_r 16$ of the dielectric frame.

17. The package for housing a high-frequency semiconductor element of claim 12 or 13, wherein an upper ground layer is provided on a surface of the dielectric frame of an opposite side to the dielectric substrate, and side ground layers are provided in an interior of the dielectric frame above the connecting conductor layer.

18. The package for housing a high-frequency semiconductor element of claim 12 or 13, wherein the dielectric substrate and the dielectric frame are made of one or more materials selected from the group consisting of alumina, mullite, glass ceramics, polytetrafluoroethylene (PTFE), glass epoxy resins and polyimides.

19. The package for housing a high-frequency semiconductor element of claim 12 or 13, wherein the line conductor and the first ground layers are made of one or more materials selected from the group consisting of Cu, MoMn+Ni+Au, W+Ni+Au, Cr+Cu, Cr+Cu+Ni+Au, Ta$_2$N+NiCr+Au, Ti+Pd+Au, and NiCr+Pd+Au.

20. A high-frequency semiconductor apparatus comprising:
    a semiconductor element installed in a space on the dielectric substrate of the package for housing a high-frequency semiconductor element of claim 1, 4 or 12, enclosed by the frame, the semiconductor element being electrically connected to the input/output feedthrough for high-frequency.

* * * * *